United States Patent [19]

Tucker et al.

[11] 4,308,443

[45] Dec. 29, 1981

[54] INDUCTION COOK-TOP WITH IMPROVED TOUCH CONTROL

[75] Inventors: Raymond M. Tucker; Clarence L. Dyer; Gregory P. Maman, all of Cleburne, Tex.

[73] Assignee: Rangaire Corporation, Cleburne, Tex.

[21] Appl. No.: 35,083

[22] Filed: May 1, 1979

[51] Int. Cl.³ .................. H05B 6/06; H05B 6/12; G08C 9/02

[52] U.S. Cl. .................. 219/10.49 R; 219/10.77; 219/506; 307/116; 340/365 C; 340/365 E; 328/5; 200/DIG. 1

[58] Field of Search .............. 219/10.77, 10.49 R, 219/10.55 B, 445, 453, 459, 492–494, 490, 497, 499, 501, 506; 200/DIG. 1; 307/116, 126, 96, 97, 308, 252 K, 252 M, 238, 239, 296; 363/57, 135, 95, 96; 361/94, 97; 328/48, 71, 5; 340/365 S, 365 C, 365 E, 366 R, 382, 716; 235/92 CT, 92 EV, 92 PE; 323/101

[56] References Cited

U.S. PATENT DOCUMENTS

| | | | |
|---|---|---|---|
| 3,530,310 | 9/1970 | Adelson et al. | 340/365 C |
| 3,530,499 | 9/1970 | Schroeder | 219/10.49 R |
| 3,637,970 | 1/1972 | Cunningham | 219/10.75 |
| 3,697,716 | 10/1972 | Kornrumpf | 219/10.49 R |
| 3,697,717 | 10/1972 | Kornrumpf | 219/10.49 R |
| 3,701,869 | 10/1972 | Jacob et al. | 200/167 R |
| 3,710,062 | 1/1973 | Peters, Jr. | 219/10.49 R |
| 3,711,672 | 1/1973 | Moreland | 219/10.49 R |
| 3,715,550 | 2/1973 | Harnden, Jr. | 219/10.49 R |
| 3,719,789 | 3/1973 | Harnden, Jr. | 219/10.49 R |
| 3,742,173 | 6/1973 | Kornrumpf et al. | 219/10.41 |
| 3,742,174 | 6/1973 | Harnden, Jr. | 219/10.49 R |
| 3,742,175 | 6/1973 | Harnden, Jr. | 219/10.49 R |
| 3,742,178 | 6/1973 | Harnden, Jr. | 219/10.49 R |
| 3,742,179 | 6/1973 | Harnden, Jr. | 219/10.49 R |
| 3,742,337 | 6/1973 | Digneffe | 307/252 B |
| 3,745,290 | 7/1973 | Harnden, Jr. et al. | 219/10.49 R |
| 3,745,450 | 7/1973 | Wilt | 340/382 |
| 3,761,667 | 9/1973 | Walden | 219/10.49 R |
| 3,761,668 | 9/1973 | Harnden, Jr. et al. | 219/10.49 R |
| 3,770,928 | 11/1973 | Kornrumpf et al. | 219/10.49 R |
| 3,775,577 | 11/1973 | Peters, Jr. | 219/10.49 R |
| 3,777,094 | 12/1973 | Peters, Jr. | 219/10.49 R |
| 3,781,503 | 12/1973 | Harnden, Jr. et al. | 219/10.49 R |
| 3,781,504 | 12/1973 | Harnden, Jr. | 219/10.49 R |
| 3,781,506 | 12/1973 | Ketchum | 219/10.49 R |
| 3,781,508 | 12/1973 | Steigerwald | 219/10.49 R |
| 3,786,219 | 1/1974 | Kornrumpf et al. | 219/10.49 R |
| 3,786,220 | 1/1974 | Harnden, Jr. | 219/10.49 R |
| 3,786,222 | 1/1974 | Harnden, Jr. et al. | 219/10.49 R |
| 3,796,850 | 3/1974 | Moreland et al. | 219/10.49 R |
| 3,806,688 | 4/1974 | Mackenzie et al. | 219/10.49 R |
| 3,814,888 | 6/1974 | Bowers et al. | 219/10.49 R |
| 3,820,005 | 6/1974 | Steigerwald | 219/10.77 X |
| 3,823,297 | 7/1974 | Cunningham | 219/10.77 |
| 3,843,857 | 10/1974 | Cunningham | 219/10.49 R |
| 3,852,558 | 12/1974 | McCleerey et al. | 219/10.49 R |
| 3,886,342 | 5/1975 | Peters, Jr. | 219/10.49 R |
| 3,887,781 | 6/1975 | Peters, Jr. | 219/10.49 R |
| 3,887,848 | 6/1975 | Larson et al. | 200/DIG. 1 |
| 3,889,090 | 6/1975 | Makenzie | 219/10.49 R |
| 3,898,410 | 8/1975 | Peters, Jr. | 219/10.49 R |
| 3,906,181 | 9/1975 | Hibino et al. | 219/10.49 R |
| 3,925,633 | 12/1975 | Partridge | 219/10.49 R |
| 3,927,336 | 12/1975 | Carlson et al. | 307/116 X |
| 3,928,744 | 12/1975 | Hibino et al. | 219/10.49 R |
| 3,932,801 | 1/1976 | Peters, Jr. | 219/10.49 R X |
| 3,947,652 | 3/1976 | Cobb | 219/10.79 |
| 3,949,183 | 4/1976 | Usami et al. | 219/10.49 |
| 3,953,783 | 4/1976 | Peters, Jr. | 219/10.49 R X |
| 3,966,426 | 6/1976 | McCoy et al. | 219/10.49 R X |
| 3,974,472 | 8/1976 | Gould, Jr. | 219/506 X |
| 4,010,342 | 3/1977 | Austin | 219/10.49 R |
| 4,011,428 | 3/1977 | Fosnough et al. | 219/10.55 B |
| 4,046,991 | 9/1977 | Sefton et al. | 219/497 |
| 4,074,101 | 2/1978 | Kiuchi et al. | 219/10.49 R |
| 4,081,700 | 3/1978 | Hamilton | 328/5 X |
| 4,105,902 | 8/1978 | Iwai et al. | 340/365 E X |
| 4,149,217 | 4/1979 | Tucker | 219/10.77 |
| 4,158,759 | 6/1979 | Mason | 219/506 X |

OTHER PUBLICATIONS

"Power on Reset For Machine Circuits", IBM Technical Disclosure Bulletin, vol. 9, No. 6, Nov. 1966.

G.E. Semiconductor Products Department, "A Low Cost, Ultrasonic Frequency Inverter using a Single SCR," Note 200.49, Neville Mapham, Feb., 1967.

Environmental/one, "Annual Report, Licensing Business".

IEEE Transactions on Industry Applications, "The

Induction Range: Its Performance and Its Development Problems", W. C. Moreland II, Jan./Feb., 1973, vol. 1A-9, No. 1.
IEEE Transactions on Industry Applications, "A Portable Cool-Surface Induction Cooking Appliances", Philiph, Peters, Nov./Dec. 1974, vol. 1A-10, No. 6.
"Induction Range Circuits-Past, Present, Future", Jul. 30, 1973.
"Non-Heating Range Using Induction Method", Mitsubishi Electric Corp.
RCA, Solid State Division, Thyristors and Rectifiers "Characteristics and Applications of RCA Fast-Switching ASCR's", Application note AN6456, Henri Digneffe, Jan. 1976.
"Solid State Power Control Program", Dr. Richard G. Hoft, Aug. 21, 1973.

*Primary Examiner*—Gene Z. Rubinson
*Assistant Examiner*—Philip H. Leung
*Attorney, Agent, or Firm*—Richards, Harris & Medlock

[57] ABSTRACT

An induction heating system (40) is provided and includes a plurality of induction heating coils (118). Touch control pads (50, 52, 70, and 72) are provided together with circuitry (80) for generating energization control signals. Circuitry (112 and 116) is provided for electrically energizing the induction heating coils (118). An electronic digital processor (82) is responsive to the energization control signals for generating energization signals for actuating and controlling the energization circuitry (112 and 116) to thereby vary the energization of the plurality of induction heating coils (118). Circuitry (150 and 152) is provided for maintaining touch control pads (50, 52, 70 and 72) operable when an operator is in contact with a pan disposed adjacent the plurality of induction heating coils (118).

13 Claims, 24 Drawing Figures

INDUCTION COOK-TOP WITH IMPROVED TOUCH CONTROL

RELATED APPLICATIONS

This application is an improvement of co-pending U.S. patent application Ser. No. 819,164, filed July 26, 1977, U.S. Pat. No. 4,169,222, and entitled "Induction Cook-Top System and Control" and U.S. patent application Ser. No. 819,169, filed July 26, 1977, U.S. Pat. No. 4,149,217, and entitled "Touch Control Panel For Induction Heating Cook-Top."

TECHNICAL FIELD

This invention relates to cook systems, and more particularly relates to an induction cook-top system.

BACKGROUND ART

The basic principles of induction heating have been known for quite some time. It has heretofore been known to utilize power sources including rectifiers and inverters in order to drive an induction heating coil, thereby producing an alternating magnetic field which is coupled through a planar cooling surface to a cooking pan in order to provide cooking action. Examples of such previously developed induction cooking systems may be found in U.S Pat. No. 3,637,970 issued to Cunningham on Jan. 25, 1972 and entitled "Induction Heating Apparatus"; U.S. Pat. No. 3,697,716 issued to Kornrumpf on Oct. 10, 1972 and entitled "Induction Cooking Power Converter with Improved Coil Position" and U.S. Pat. No. 3,823,297 issued to Cunningham on July 9, 1974 and entitled "Load Controlled Induction Heating". It has also been known to utilize touch control devices to control the operation of such induction cooking devices.

Previously developed induction cook-top devices have not provided adequate control systems for controlling the energization, deenergization and variation of heating levels of induction heating coils. Lack of such control introduces unsafe operating conditions in the use of induction cook-top devices. For example, one such unsafe operating characteristic observed in prior art induction cook-top devices has been the inability to decrease a heating level of an induction heating coil when the induction heating coil is operating at a high level and the operator is in physical contact with the cooking pan or a utensil, such as a spoon, inside the cooking pan. The operator must therefore remember not to touch the cooking pan or a utensil in order to decrease the heating level or shut off an induction heating coil. This operating requirement makes the operation of induction cooking devices cumbersome and hazardous. Consequently, a need has arisen for an induction cook-top system which is economical to manufacture and simple in operation, including touch controls that are accurate to safely control heating levels and energization of the system.

DISCLOSURE OF THE INVENTION

In accordance with the present invention, an induction cook-top system is provided which substantially eliminates or reduces the problems heretofore present in prior multi-coil induction cook-tops utilizing touch control systems and visual displays.

In accordance with the present invention in an induction cooking system a plurality of induction heating coils is provided. Circuitry is provided for electrically energizing the plurality of induction heating coils. Controls are provided for generating energization control signals. Circuitry is further provided being responsive to the energization control signals generated by the controls for generating energization signals. The energization signal actuate and control the energization circuitry to thereby vary the energization of the plurality of induction heating coils. Circuitry is provided for maintaining the controls operable when an operator is in contact with a pan disposed adjacent the plurality of induction heating coils. Circuitry is further provided for reducing the voltage stress on the energization circuitry without changing the normal operating voltage levels of the energization circuitry.

BRIEF DESCRIPTION OF DRAWINGS

For a more complete understanding of the present invention and for further objects and advantages thereof, reference is now made to the following Detailed Description taken in conjunction with the accompanying Drawings in which.

DETAILED DESCRIPTION

Figure 1:
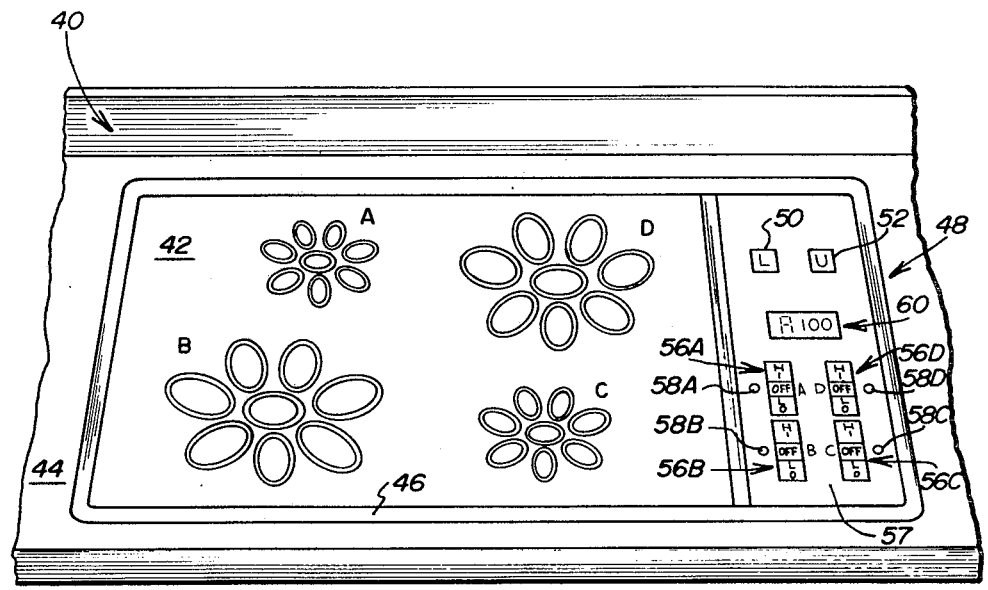
FIG. 1 is a perspective top view of an induction cook-top utilizing a touch control panel according to the present invention.

Referring to FIG. 1, a perspective top view of an induction cook-top surface is illustrated and is generally identified by the numeral 40. Cook-top surface 40 includes a rectangular planar surface 42 having four cooking units or areas identified as A, B, C and D provided thereon. Cooking areas A and C are smaller than cooking areas B and D in order to enable the accommodation of different size cooking pans. Surface 42 comprises a suitable ceramic or other material able to withstand high temperatures. Circular patterned indicia are formed in surface 42 to denote cooking areas A, B, C and D which are above four induction heating coils, not shown in FIG. 1, and which are located beneath surface 42.

Surface 42 is maintained in place within a conventional kitchen counter 44 by a stainless steel mounting rim 46. A touch control panel of cook-top surface 40 is generally identified by the numeral 48 and includes touch control areas or pads 56 associated with each cooking area A-D. Touch control pads 56 provide control of cooking areas A-D when the operator places a finger in contact with a designated surface of touch control pads 56. Touch control pads 56 illustrated in FIG. 1 comprise merely indicia formed on a glass plate 57 and do not require physical depression by the operator.

Figure 2:
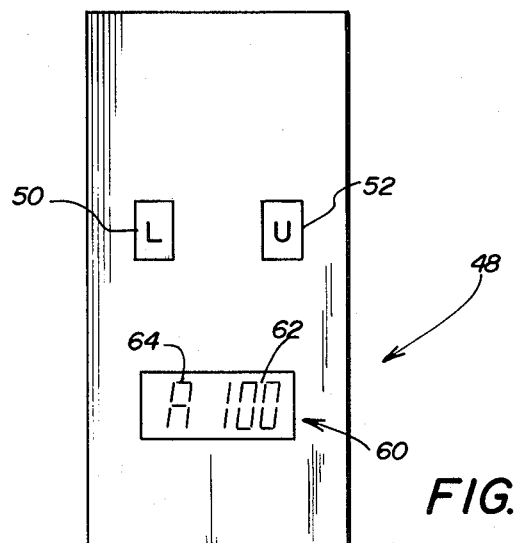
FIG. 2 is a top plan view of the touch control panel of the present invention shown in FIG. 1.
Figure 2:
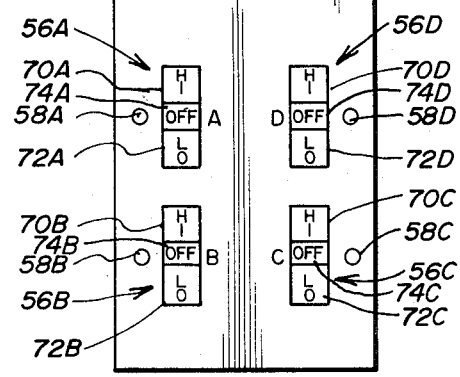

Referring simultaneously to FIGS. 1 and 2, touch control panel 48 includes a LOCK TOUCH CONTROL PAD 50 and an UNLOCK TOUCH CONTROL PAD 52 provided at the upper portion of touch control panel 48. The operation of LOCK TOUCH CONTROL PAD 50 and UNLOCK TOUCH CONTROL PAD 52 will be subsequently described. Associated with each touch control pad 56 is a status display indicator 58, 58A-58D, to provide a visual indication when one or more cooking areas A-D are energized. Touch control panel 48 further includes a display generally identified by the numeral 60 for alternately displaying a visual indication of the desired power to be delivered to each of the cooking aread A-D. A representation of the cooking power desired is displayed in display 62 while the letter of the corresponding cooking area A-D is illustrated in display 64.

Touch control pads 56 each include a HI TOUCH CONTROL PAD 70, 70A-70D, and a LOW TOUCH CONTROL PAD 72, 72A-72D, which may be touched by the operator in order to set the heat indicator at a desired level. Touch control pads 56 further include an OFF TOUCH CONTROL PAD 74, 74A-74D, which may be touched by the operator in order to shut the associated cooking area A-D off. OFF TOUCH CONTROL PAD 74 is disposed between HI TOUCH CONTROL PAD 70 and LOW TOUCH CONTROL PAD 72, such that the finger of an operator when in contact with OFF TOUCH CONTROL PAD 74 bridges the area between HI TOUCH CONTROL PAD 70 and LOW TOUCH CONTROL PAD 72 to simultaneously touch both HI TOUCH CONTROL PAD 70 and LOW TOUCH CONTROL PAD 72.

In operation of induction cook-top surface 40, touch control pads 56 are initially locked in an off condition. The operator's finger is initially placed on the UNLOCK TOUCH CONTROL PAD 52 to enable operation of touch control pads 56. The operator may then turn on a cooking area A-D by touching a HI TOUCH CONTROL PAD 70. As soon as a HI TOUCH CONTROL PAD 70 is touched, the corresponding status display indicator 58 is illuminated to indicate that a cooking area has been selected.

For example, if an operator desires to turn on cooking area A, HI TOUCH CONTROL PAD 70A is lightly touched with one finger by the operator. No pressure or depression by the finger of the operator is required. The display 64 displays the letter "A" to indicate that cooking area A is actuated. Display 62 will display in increments of ten the relative cooking power delivered to the cooking area A until 100 is reached. The percentage of the total power available for cooking area A will continue to increase depending upon the length of time the operator's finger is held on HI TOUCH CONTROL PAD 70A until 100 is reached, as illustrated in FIG. 2. The displayed power percentage rises at a relatively fast rate when a HI TOUCH CONTROL PAD 70 is touched.

To adjust the heat setting of a cooking area A-D, the LOW TOUCH CONTROL PADS 72 are utilized. The amount of power applied to a cooking area A-D will decrease as long as the operator's finger is held on LOW TOUCH CONTROL PAD 72A until display 62 indicates a 0. The rate of decrease in power to a cooking area is at a much slower rate, in increments of one, than the increase rate of ten controlled by HI TOUCH CONTROL PAD 70, thus enabling a very accurate setting of the desired cooking power level. If the operator desires to again raise the temperature of cooking area A, it will be necessary to touch UNLOCK TOUCH CONTROL PAD 52.

The heat applied to each cooking area B-D may be regulated in a similar manner by touching touch control pads 56B-56D of the respective positions of touch control panel 48.

In order to turn a cooking unit completely off, the operator touches both the HI TOUCH CONTROL PAD 70 and the LOW TOUCH CONTROL PAD 72 for a cooking area A-D at the same time by placing a finger on each pad. The cooking area will be immediately turned off and the status display indicator 58 will be extinguished. The display 64 will indicate the cooking area A-D previously actuated and display 62 will illustrate a 0. If none of the other cooking areas are on, display 60 will indicate the time of day.

The use of LOCK TOUCH CONTROL PAD 50 will cause all touch control pads 56 to be locked for a predetermined time, such as for five seconds, and each cooking area A-D will remain at its heat level setting at the time LOCK TOUCH CONTROL PAD 50 was touched. Thereafter, touching any of touch control pads 56 will have no effect on heating levels as long as induction cook-top surface 40 is in the locked mode. In order to restore operation from the locked mode before the predetermined locked time has elapsed, the operator merely touches UNLOCK TOUCH CONTROL PAD 52. UNLOCK TOUCH CONTROL PAD 52 must be touched before any cooking area A-D can be turned on or the power level setting of a cooking area A-D increased. While any of the cooking areas A-D are on, holding the operator's finger on LOCK TOUCH CONTROL PAD 50 for a predetermined time will cause display 60 to indicate the time of day and touch control pads 56 will be inoperative. After a predetermined time after the operator's finger is removed from LOCK TOUCH CONTROL PAD 50, display 60 will revert to display the cooking area A-D in display 62 and the relative percent of heat applied to the cooking area A-D in display 62.

Touch control panel 48 provides numerous safety features. Cook-top surface 40 is automatically locked in the off position when power is initially applied to cook-top surface 40 and cook-top surface 40 cannot be operated unless UNLOCK TOUCH CONTROL PAD 52 is touched. When cook-top surface 40 is turned on by holding of a finger on UNLOCK TOUCH CONTROL PAD 52, a cooking area A-D must be turned on within a predetermined time period, such as five seconds, or cook-top surface 40 and touch control pads 56 will automatically turn off. Each of cooking areas A-D may be turned off immediately by touching both HI and LOW TOUCH CONTROL PADS 70 and 72 associated with a cooking area A-D simultaneously. Due to the present inductive heating design, heat is immediately extinguished and cook-top surface 40 does not retain heat which could cause serious burns to the operator.

As will subsequently be described, cooking areas A-D will not operate unless a proper cooking pan is placed on the cooking area A-D. If the cooking area A-D is turned on with an improper pan or with no pan on the cooking area A-D, status display indicator 58 for that cooking area will flash for a predetermined time, such as forty seconds, or until the proper pan is put on the cooking area A-D. During the flashing of status display indicator 58, no heat is generated from the cooking area A-D. If a pan is removed from the cooking area A-D during the cooking operation, the cooking area A-D will automatically terminate heating and the status display indicator 58 will flash. If the pan is returned to the cooking area A-D within a predetermined time period after removal, heating will resume in that cooking area. Otherwise, at the end of this predetermined time period, the cooking area A-D will return to the off state and status display indicator 58 will be extinguished.

Each cooking area A-D is equipped with a sensor which will turn the cooking area A-D off if a maximum level of operating temperature is exceeded, such as would occur if a cooking pan boiled dry.

Figure 3:
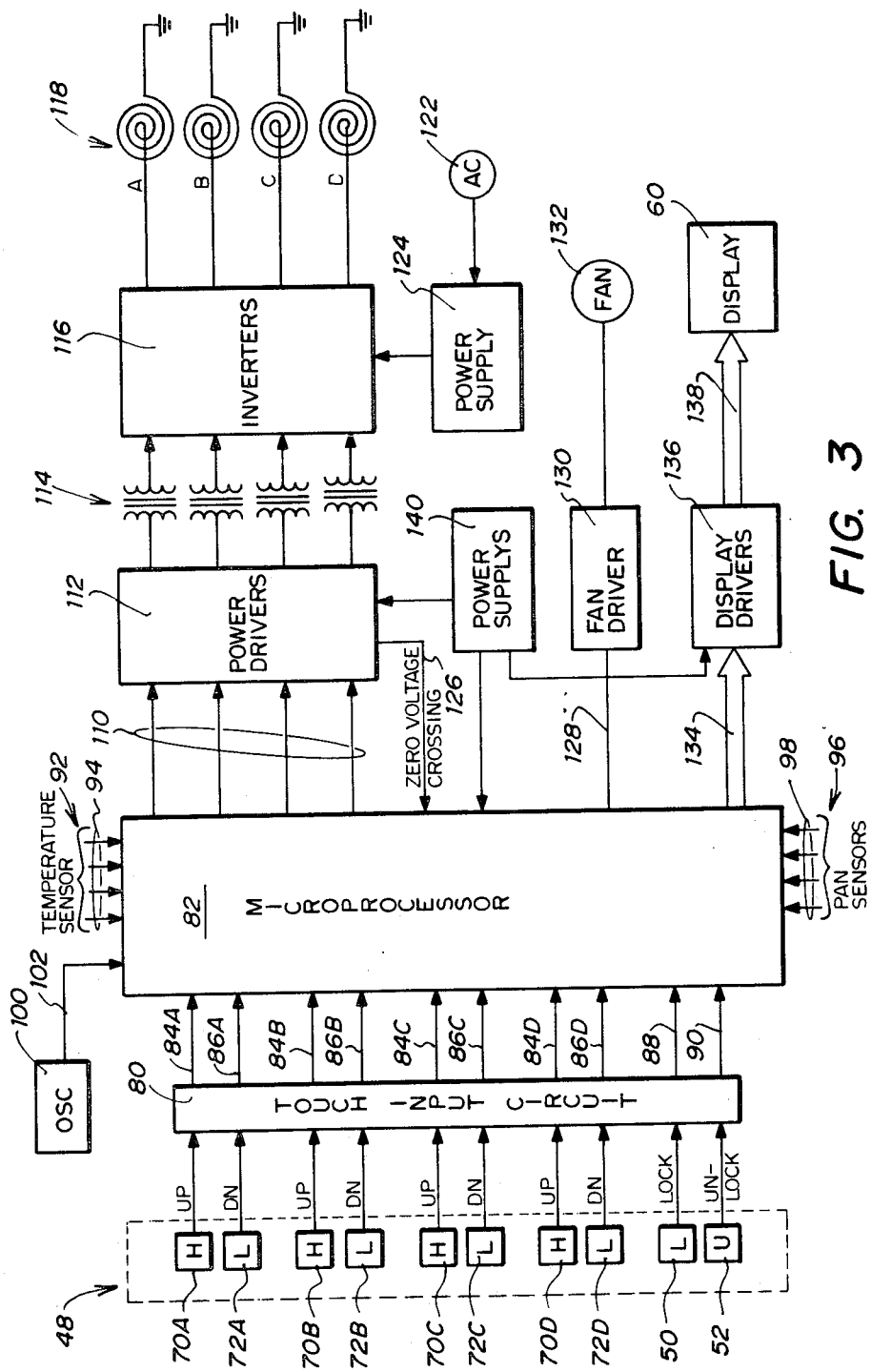
FIG. 3 is an electrical block diagram of the electrical control and logic circuitry of the touch control panel of the present invention.

Touch control panel 48 is constructed to minimize fabrication expense while providing ease of maintenance. Such a control panel is described in co-pending U.S. patent application Ser. No. 810,169 filed July 26, 1977 and entitled "Touch Control Panel for Induction Heating Cook-top" and assigned to the assignee of the present invention. FIG. 3 illustrates a block diagram of the electrical circuitry of the present touch control panel 48. Touch control panel 48 includes HI and LOW TOUCH CONTROL PADS 70, 72, LOCK TOUCH CONTROL PAD 50 and UNLOCK TOUCH CONTROL PAD 52. Touch control pads 70, 72, 50 and 52 are interconnected to touch input circuit 80 which senses that a touch control pad 70, 72, 50 and 52 has been touched by an operator. Touch input circuit 80 senses which of touch control pads 70, 72, 50 and 52 have been touched and provides energization control signals for cooking areas A-D to a microprocessor circuit 82 via signal lines 84, 86, 88 and 90. Logic signals are also applied to microprocessor circuit 82 from temperature sensors generally identified by the numeral 92 via signal lines 94 and pan sensors generally identified by the numeral 96 via signal lines 98 located adjacent each of the cooking areas A-D. Microprocessor circuit 82 also receives the input from an oscillator 100 via a signal line 102.

Microprocessor circuit 82 generates energization signals for cooking areas A-D and applies these energization signals via signal lines 110 to power drivers 112 which generate selected electrical power signals through transformers generally identified by the numeral 114 to inverters 116. The outputs of inverters 116 are applied to the designated one of four induction heating coils generally identified by the numeral 118, one each for cooking areas A-D. Induction heating coils 118 are located beneath surface 42 of induction cook-top surface 40 in the vicinity of cooking areas A-D.

AC voltage is applied from a power source 122 to a DC power supply 124 whose output is applied to inverters 116 in the manner to be subsequently described. Circuitry associated with power drivers 112 senses the zero voltage potential crossing of the AC voltage potential and generates the ZERO VOLTAGE CROSSING signal applied along signal line 126 to microprocessor circuit 82. The function of the ZERO VOLTAGE CROSSING signal will be subsequently described.

An output of microprocessor circuit 82 is applied along signal line 128 to fan driver 130 for operating a fan 132 located within the interior of induction cook-top surface 40 to provide cooling. Fan 132 operates when UNLOCK TOUCH CONTROL PAD 52 is touched and is deactivated after all cooking areas A-D have been turned off.

Microprocessor circuit 82 also generates via signal lines 134 output signals to display drivers 136 which generate signals via signal lines 138 to operate display 60.

AC power is also applied to a power supply 140 which supplies power to power drivers 112, microprocessor circuit 82, fan driver 130, display drivers 136 and touch input circuit 80.

Figure 4:
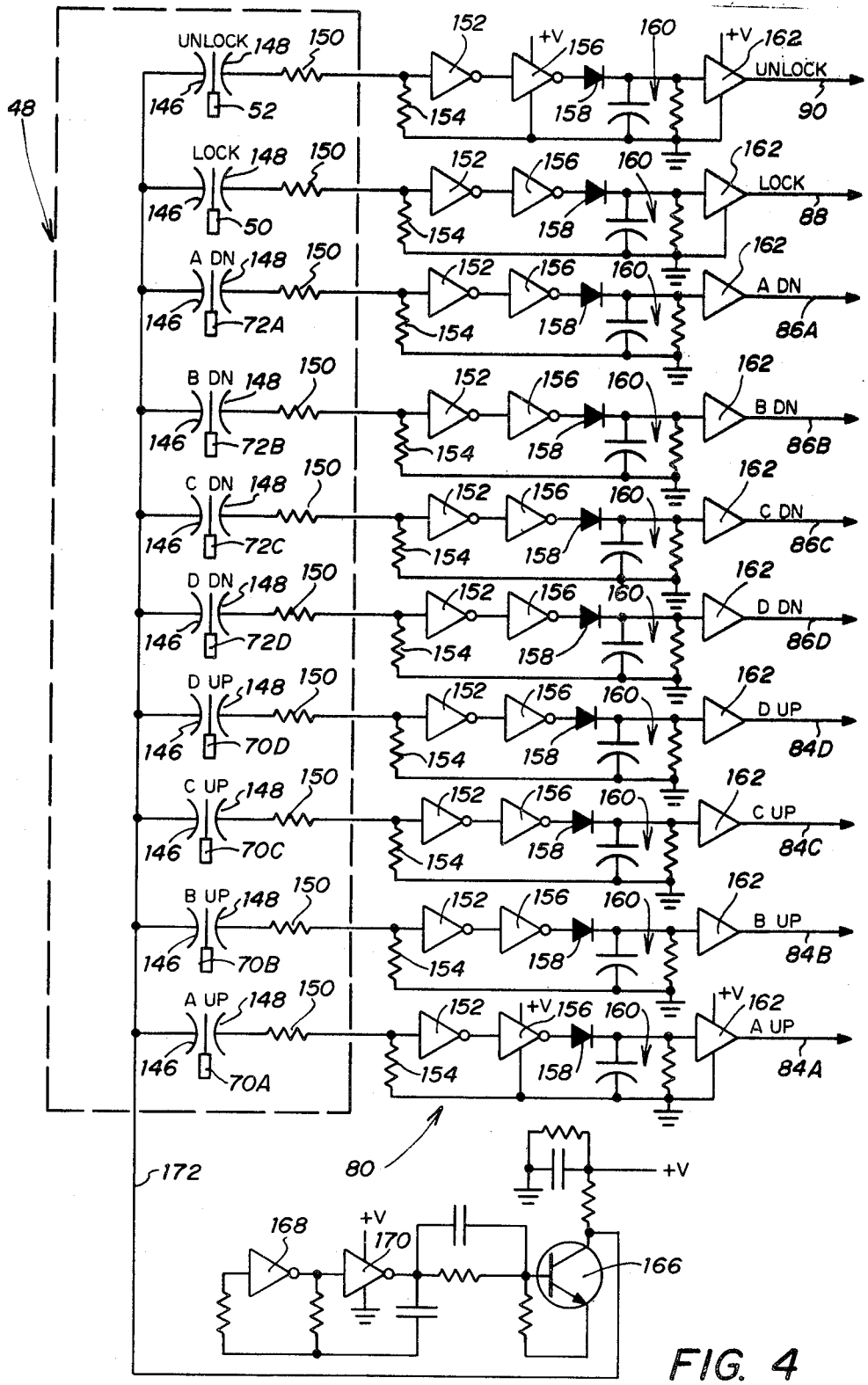
FIG. 4 is a detailed schematic diagram of the touch pads and touch input circuit shown in the block diagram of FIG. 3.

Referring to FIG. 4, schematic circuitry corresponding to the touch input circuit 80 (FIG. 3) is illustrated. Each touch control pad 70, 72, 50 and 52 operate in a similar manner and therefore only the circuitry associated with UNLOCK TOUCH CONTROL PAD 52 will be described herein. UNLOCK TOUCH CONTROL PAD 52 in conjunction with copper areas 146 and 148 located below touch control panel 48 (FIG. 1) is interconnected through a high impedance resistive divider comprising resistors 150 and 154 to an inverter 152. Resistor 150 may comprise, for example, a 9.1 megohm resistance and resistor 154 may comprise, for example, a 2.2 megohm resistance.

The high impedance voltage divider comprising resistors 150 and 154 in association with a high voltage, such as 300 peak-to-peak volts, raises the voltage level applied to the input of inverter 152 substantially above any noise impressed upon the touch control pads 70, 72, 50 and 52. In prior touch control devices utilizing lower impedances and lower voltages, noise generated by the system power circuits has been able to disrupt desired switching of the prior systems. The present circuitry eliminates such problems caused by noise associated with the touch control pads 70, 72, 50 and 52 by attenuating any noise present to prevent such noise from overriding the signals generated by actuation of touch control pads 70, 72, 50 and 52. The output of inverter 152 is applied to an inverter 156. The output of inverter 156 is applied to a diode 158 whose output is applied through a resistor-capacitor filter network 160 to a buffer 152. The output of buffer 162 is supplied via a signal line 90 to microprocessor circuit 82 (FIG. 3).

As noted, an important aspect of the present invention is the use of resistors 150 and 154 to provide a high impedance resistive voltage divider at the input of inverter 152 to insure a proper voltage level at the input of inverter 152. This proper voltage level is necessary to permit actuation of touch control pads 70, 72, 50 and 52 while an operator is touching a pan or utensil within a pan when cooking power is being applied to the pan or utensil.

A pulsed high voltage signal is applied to copper area 146 through a transistor 166 having a bias circuitry composed of inverters 168 and 170 together with associated resistors and capacitors. The output of transistor 166 is applied via signal line 172 to copper areas 146 to provide voltage drive for touch control pads 70, 72, 50 and 52.

Figure 5:
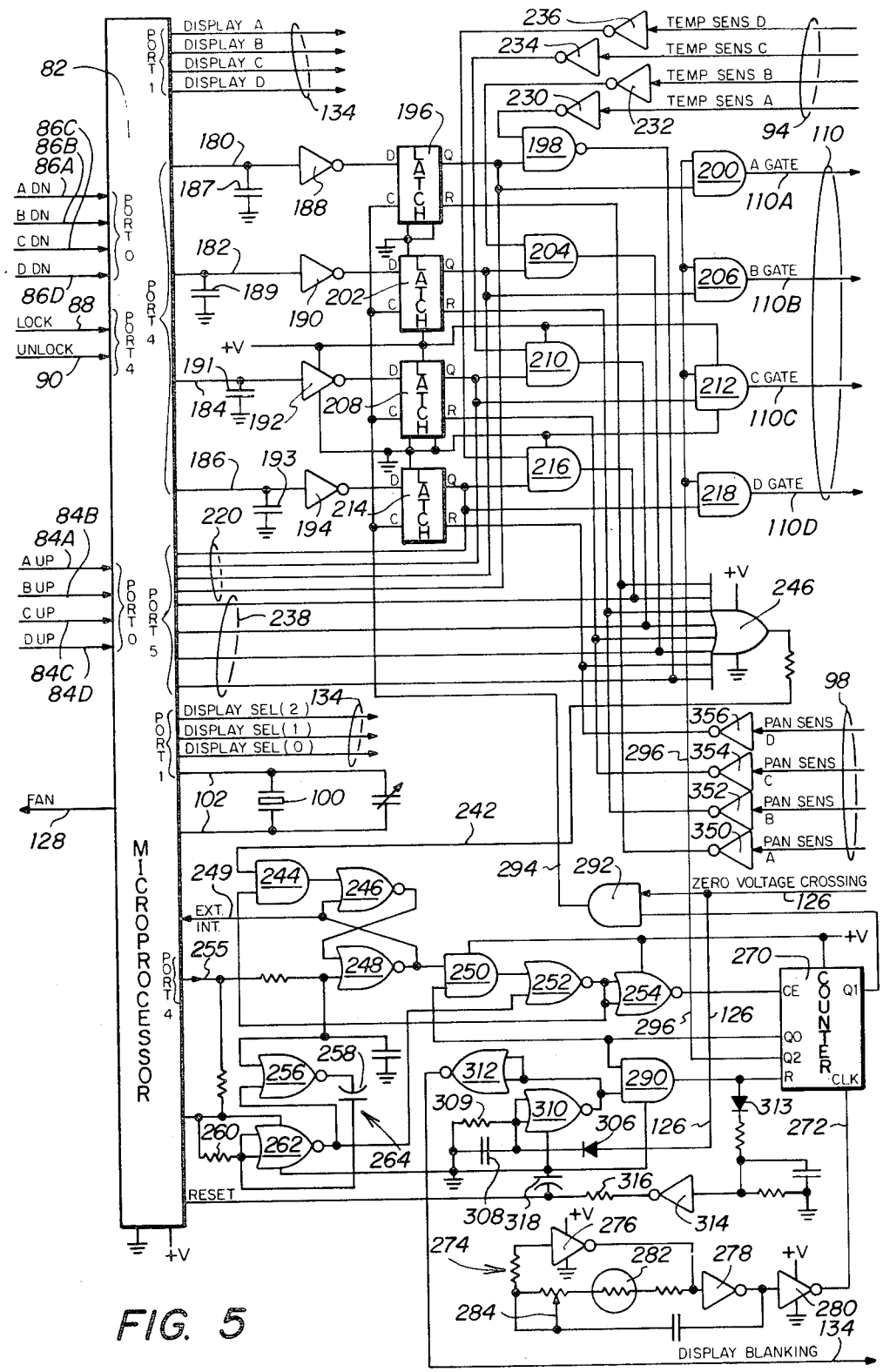
FIG. 5 is a detailed schematic diagram of the microprocessor and related circuitry shown in the block diagram of FIG. 3.

Referring to FIG. 5, microprocessor circuit 82 and associated circuitry is illustrated. Microprocessor circuit 82 includes, in addition to associated circuitry, a microprocessor circuit such as an MC3870 I/C 8-bit microcomputer manufactured and sold by Motorola Semiconductor Products, Inc. of Austin, Texas. As previously stated, microprocessor circuit 82 receives as input signals the control signals generated by touch input circuit 80 (FIG. 3). These signals are applied to microprocessor circuit 82 via signal lines 84, 86, 88 and 90. The output of microprocessor 82 indicating that a particular touch control pad 70, 72, 50 or 52 has been touched is applied via signal lines 180, 182, 184 and 186 to inverters 188, 190, 192, and 194. Signal lines 180, 182, 184 and 186 are decoupled by capacitors 187, 189, 191 and 193. The output of inverter 188 is applied to a latch 196. The output of latch 196 is applied to an AND gate 198 and an AND gate 200 whose output generates the A GATE signal via signal line 110A which is applied to power drivers 112 (FIG. 3). The output of inverter 190 is applied to a latch 202. The output of latch 202 is applied to an AND gate 204 and an AND 206 which generates the B GATE signal via signal line 110B which is applied to power drivers 112 (FIG. 3). The output of inverter 192 is applied to a latch 208. The output of latch 208 is applied to an AND gate 210 and an AND gate 212 whose output generates the C GATE signal via signal line 110C which is applied to power drivers 112 (FIG. 3). Similarly, the output of inverter 194 is applied to a latch 214. The output of latch 214 is applied to an AND gate 216 and an AND gate 218 which generates the D GATE signal via signal line 110D which is applied to power drivers 112 (FIG. 3). Latches 196, 202, 208 and 214 may comprise, for example, CD4013 I/Cs. The output of latches 196, 202, 208 and 214 is also applied to microprocessor circuit 82 via signal lines 220.

AND gates 198, 204, 210 and 216 receive the TEMP SENS signal from temperature sensors 92 associated with each cooking area A-D via signal lines 94 through inverters 230, 232, 234 and 236. The output of AND gates 198, 204, 210 and 216 is applied via signal lines 238 to microprocessor circuit 82 and to an OR gate 240.

The output of OR gate 240 is applied via signal line 242 to an AND gate 244. The output of AND gate 244 is applied to a NOR gate 246. The output of NOR gate 246 is applied to an input of NOR gate 248 whose output is applied also via signal line 249 to microprocessor circuit 82 and as an input to NOR gate 246. The output of NOR gate 248 generates the EXTERNAL INTERRUPT signal to microprocessor circuit 82 and is applied to an input of an AND gate 250. The output of AND gate 250 is applied to a NOR gate 242 whose output is applied to a NOR gate 254 and AND gate 244. An output of microprocessor circuit 82 via signal line 255 is applied to NOR gate 248 and to a NOR gate 256 whose output is applied through a capacitor 258 and a resistor 260 to a NOR gate 262. The output of NOR gate 262 is applied as an input to NOR gate 252.

The output of NOR gate 254 is applied to a counter 270. Counter 270 may comprise, for example, a CD4017 I/C. The CLOCk signal applied to counter 270 is applied via signal line 272 from a 250 KHz oscillator generally identified by the numeral 274. Oscillator 274 includes inverters 276, 278 and 280. Temperature compensation is provided by a thermistor 282, and the frequency of oscillator 274 is adjusted using a variable resistor 284. Thermistor 282 provides temperature compensation which causes the frequency of GATE signals applied via signal lines 110 to decrease with increasing temperature to prevent any possible thermal runaway, which could occur since oscillator 274 would normally increase its frequency as temperature increased, causing inverters 116 (FIG. 3) to develop increased wattage and further increasing temperature. Without this circuit, in the presence of inadequate ventilation, problems could arise due to increased temperature, thereby causing malfunction of SCRs 530 and 554 (FIG. 8) and possibly blowing of a fuse.

Counter 270 functions to provide ten phases of timing signals for timing functions. A PHASE 0 timing signal is applied to AND gate 250 and an AND gate 290. A PHASE 1 timing signal is applied from counter 270 to an AND gate 292 which also receives the ZERO VOLTAGE CROSSING signal applied via signal line 120 from power drivers 112 (FIG. 3). The output of AND gate 292 is applied via signal line 294 to the clock input of latches 196, 202, 208 and 214. The PHASE 2 timing signal generated by counter 270 is applied via signal line 296 to AND gates 200, 206, 212 and 218 to control the frequency of the GATE signals applied via signal lines 110 to power drivers 112 (FIG. 3).

The ZERO VOLTAGE CROSSING signal applied via signal line 126 is also applied through a diode 306, capacitor 308 and a resistor 309 to a NOR gate 310 whose output is applied to AND gate 290 and to a NOR gate 312. The output of NOR gate 312 generates the DISPLAY BLANKING signal applied via signal line 134 to display drivers 136 (FIG. 3). The output of AND gate 290 is applied to counter 270 to supply a RESET signal to counter 270 and through a diode 313, inverter 314, resistor 316 and capacitor 318 to microprocessor circuit 82 to provide a RESET signal to microprocessor circuit 82. The RESET signal to microprocessor circuit 82 insures that microprocessor circuit 82 is reset to zero in the event of a power failure. The reset circuitry including diodes 306 and 313, NOR gates 310 and 312, resistor 316, inverter 314 and capacitor 318 functions to reset microprocessor circuit 82 only in the event that there is a loss of power and not a temporary loss of power such as a loss caused by a lightning strike.

It has been recognized that in the process of energizing a cooking area A-D and generating GATE signals via signal lines 110 within too short a time period after turning a cooking area A-D off, this condition will activate a fuse associated with the energized cooking area A-D. This problem occurs primarily when all cooking areas A-D are deenergized, microprocessor circuit 82 polls for an interrupt and then the uninterrupted cooking areas are reenergized. A delay is provided after an interrupt has been serviced by microprocessor circuit 82 and before a GATE signal generated via signal lines 110 can be reapplied to power drivers 112 (FIG. 3). The delay is provided by NOR gates 248 and 256 together with capacitor 258 and resistor 260 which comprise a timing circuit 264. Timing circuit 264 is activated by a signal applied via signal line 255 from microprocessor circuit 82. The output of timing circuit 264 is generated by NOR gate 262 whose output is applied to NOR gate 252. The output of NOR gate 262 is a logic high during the time delay which causes the output of NOR gate 252 to be a logic low to thereby cause the output of NOR gate 254 to be a logic high which prevents the PHASE 2 timing signal from being generated by counter 270.

The PAN SENS signals from pan sensors 96 (FIG. 3) associated with each cooking area A-D are applied along signal lines 98 to inverters 350, 352, 354 and 356 which apply their outputs to OR gate 240 and latches 196, 202, 208 and 214. The PAN SENS signals are applied to the reset input of latches 196, 202, 208 and 214 to reset the GATE signal applied via signal lines 110 to power drivers 112 (FIG. 3) to zero and to cause a feedback signal via signal lines 220 to be applied to microprocessor circuit 82, such that microprocessor circuit 82 can determine which cooking pan was lifted from a cooking area A-D.

It has been observed that the speed of microprocessor circuit 82 is not fast enough to adequately control the generation of GATE signals applied to power drivers 112 (FIG. 3). It is, therefore, necessary that the control of these GATE signals be performed outside of microprocessor circuit 82. The duty cycle control signals for microprocessor circuit 82 are clocked into latches 196, 202, 208 and 214 when the AC voltage potential ZERO VOLTAGE CROSSING signal is present and PHASE 1 timing signal of counter 270 is present. The GATE signal frequency, as previously described, of GATE signals to power drivers 112 (FIG. 3) is determined by oscillator 274 in combination with the PHASE 2 timing signal of counter 270. The reset inputs to latches 196, 202, 208 and 214 are used to turn a cooking area A-D off when a pan is lifted which is detected by pan sensors 96 (FIG. 3). The operation of latches 196, 202, 208 and 214 provides sufficient time for microprocessor circuit 82 to process the external interrupt and locate the pan which was removed from induction cook-top surface 40.

An input to counter 270 applied from NOR gate 254 is the CLOCK ENABLE signal, CE, and is utilized to stop generation of the timing signals of counter 270 on the PHASE 0 timing signal when a microprocessor circuit 82 external interrupt occurs. When the CLOCK ENABLE input is restored, the counter 270 timing clock signals resume counting from PHASE 0, resulting in new data being clocked into latches 196, 202, 208 and 214 from microprocessor circuit 82 through inverters 188, 190, 192 and 194. Data is clocked into latches 196, 202, 208 and 214 on the PHASE 1 timing signal and is applied to power drivers 112 (FIG. 3) through AND gates 200, 206, 212 and 218 on the PHASE 2 timing signal. The reset input of counter 270 applied from AND gate 290 is used to stop counter 270 on the PHASE 0 timing signal when the ZERO VOLTAGE CROSSING signal is lost. The ZERO VOLTAGE CROSSING signal can be lost due to the loss of AC power or if the temperature of the heat sink of the temperature sensor 92 rises above a predetermined temperature, in which case the heat sink thermostat will open. The removal of the ZERO VOLTAGE CROSSING signal prevents GATE signals from being generated and applied to power drivers 112 (FIG. 3) when AC power is lost. If the ZERO VOLTAGE CROSSING signal is restored before the reset input of microprocessor circuit 82 is activated, the presumption of GATE signals generated by AND gate 202, 206, 212 and 218 is similar to when the CLOCK ENABLE signal is restored to counter 270.

Microprocessor circuit 82 further generates the various signals necessary for operating display 60. These signals include the DISPLAY A, B, C and D signals together with the DISPLAY SELECT 0, 1 and 2 signals which are applied via signal lines 134 (FIG. 3). A further output of microprocessor circuit 82 generated via signal line 128 is the FAN signal.

Figure 6:
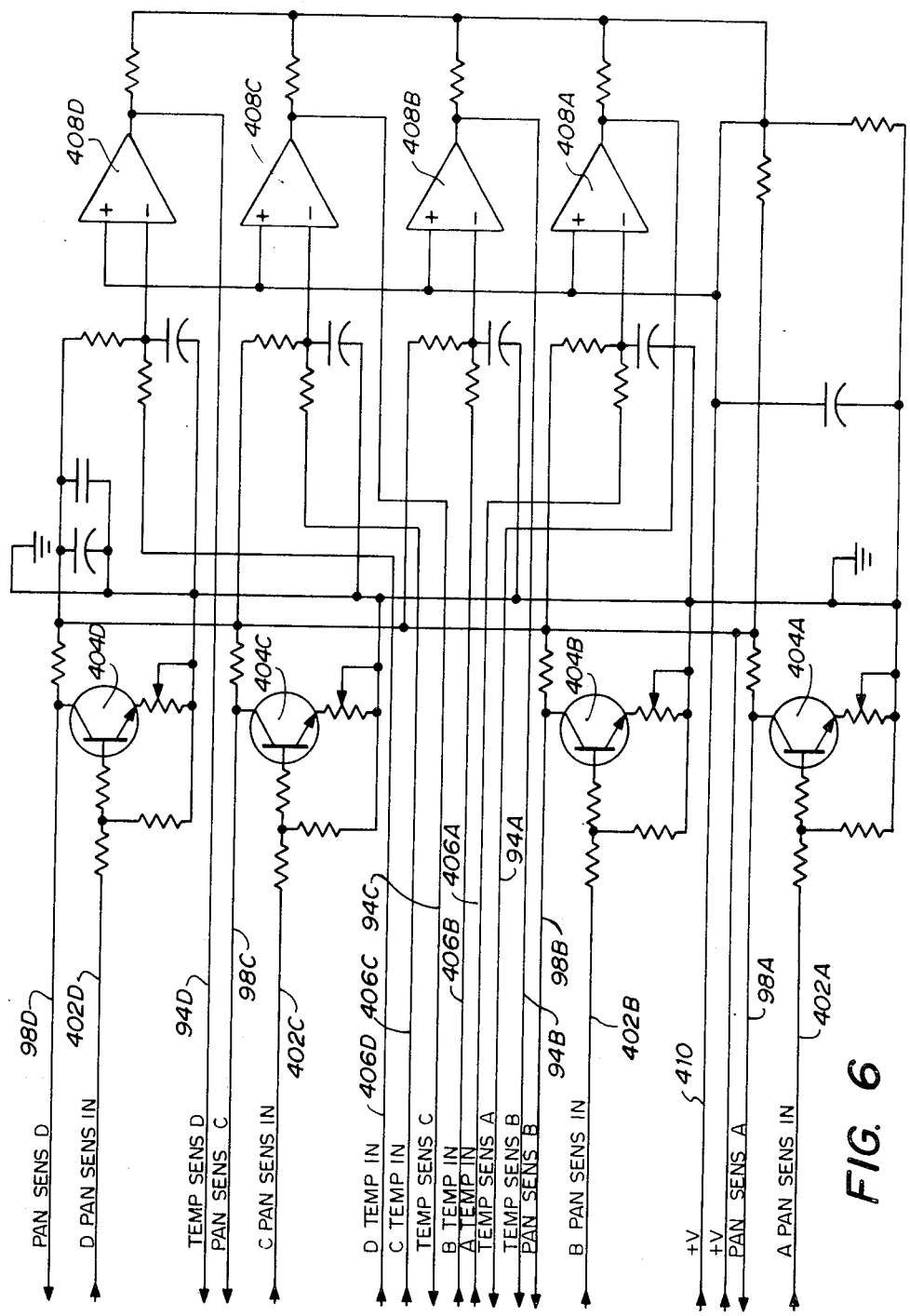
FIG. 6 is a detailed schematic diagram of the pan and temperature sensors shown in the block diagram of FIG. 3.

Referring to FIG. 6, the circuitry for generating the PAN SENS signals via signal lines 98 and the TEMPERATURE SENS signals via signal line 94 applied to the circuitry of FIG. 5 is illustrated. The circuitry for each pan sensor 96 and temperature sensor 92 of cooking areas A-D is similar and therefore, only one representative circuit will be discussed herein. For example, pan sensor 96A for cooking area A generates via signal line 402A the A PAN SENS IN signal which is applied to the base of a transistor 404A. The output of transistor 404A generates the PAN SENS A signal applied via signal line 98A to inverter 350 (FIG. 5). The TEMP IN signals are generated by temperature sensors 92A–92D whose outputs are applied via signal lines 406A-D to the inverting inputs of comparators 408A-D. The output of comparators 408 generate the TEMP SENS signals which are applied via signal lines 94 to inverters 230, 232, 234 and 236 (FIG. 5). The remaining resistors and capacitors shown in FIG. 6 provide biasing and decoupling for transistors 404 and comparators 408.

In operation when a pan is lifted, the output pulses from transistors 404A-D, PAN SENS A-D signals are inverted and level shifted from 12 volts to 5 volts by inverters 350, 352, 354 and 356 (FIG. 5). These signals increase in amplitude past the threshold of OR gate 240 and cause latches 196, 202, 208 and 214 to be reset. The output of OR gate 240 sets the output of NOR gate 248 to a logic high which triggers the EXTERNAL INTERRUPT of microprocessor circuit 82 via signal line 249. The output of NOR gate 248 is also anded with the PHASE 0 timing signal of counter 270 by AND gate 250. The output of AND gate 250 is applied to the normally low clock enable, input of counter 270, causing counter 270 to stop operation on PHASE 0 and all GATE signals on signal lines 110 are inhibited.

After the pan interrupt applied via signal lines 238 has been serviced by microprocessor circuit 82, microprocessor circuit 82 outputs a 5-volt pulse on signal line 255 to NOR gate 262 to create a twelve msec delay and resets NOR gate 248 to a logic low. After the twelve msec delay, counter 270 clock enable input is allowed to go to a logic low, causing counter 270 to resume counting starting at PHASE 0. Therefore, it can be seen that GATE signals on signal lines 110 are then enabled for all active cooking areas A-D other than the interrupted cooking area from which a pan was removed.

The software External Interrupt Routine of microprocessor circuit 82 to be subsequently described in connection with FIG. 24, first checks for the presence of a temperature input. After testing for a temperature input, the External Interrupt Routine branches to the pan sensor portion of this routine, also to be subsequently described in connection with FIG. 24. In order to detect which pan has been lifted, the output of each latch 196, 202, 208 and 214 is compared with its input. A low output and a high input indicates that the latch 196, 202, 208 or 214 reset input has received a pulse. After detecting which pan or pans have been lifted, the appropriate output along signal lines 110 is set to zero and the interrupt sources are stored in a software register to be used in the Gate Pulse Routine to be subsequently described in connection with FIG. 13 in order to maintain the interrupted element set to zero. As the interrupt routine is exited, microprocessor circuit 82 outputs the interrupt reset pulse to NOR gate 248 via signal line 255.

Again, referring to FIG. 6, in operation of temperature sensors 92, a reference voltage is applied via signal line 410 to the positive terminals of comparators 408. The output of temperature sensors 92 (FIG. 3) is applied via the TEMP IN signal on signal line 406. The TEMP IN signal voltage is normally lower than the reference voltage applied to the positive terminal of comparators 408. As long as the reference voltage is greater than the voltage applied from temperature sensors 92, the output of comparators 408 will be high. The output of comparators 408 will go low to a ground potential if the negative input becomes higher in potential than the positive input. This voltage transition can occur if either temperature sensor 92 increases in temperature above a predetermined temperature to cause the negative input of a particular comparator 408 to go above the reference voltage. A low comparator 408 output will cause the temperature interrupt sequence to begin.

The comparator 408 output, TEMP SENS, signals via signal lines 94, is inverted and level shifted by inverters 230, 232, 235 and 236 (FIG. 5) and is applied to AND gates 198, 204, 210 and 216. AND gates 198, 204, 210 and 216 also receive inputs from latches 196, 202, 208 and 214. The output of AND gates 198, 204, 210 and 216 are set to a logic high only if the GATE signal and TEMP SENS signals are present for the particular cooking area, A-D. The anding of these two signals is required to disable the temperature interrupt input to microprocessor circuit 82 via signal lines 238 after the cooking area A-D has been turned off and before the temperature sensor 92 has cooled. The output of AND gates 198, 204, 210 and 216 are applied as an input to microprocessor circuit 82 via signal lines 238 for processing and to OR gate 240 to activate the external interrupt applied to microprocessor circuit 82 via signal line 249.

As will subsequently be described, the software for microprocessor circuit 82 polls the temperature input from temperature sensors 92 in the order of cooking areas D, C, B and A. When a temperature input is discovered, the remaining cooking areas are ignored. When the cooking area A-D causing the temperature interrupt has been identified, display 64 (FIG. 1) is switched to display that cooking area, the cooking area duty cycle is set to zero and the cooking area gate output is set to a logic low. After setting the gate output low, the pan sensors 96 inputs are checked before exiting the External Interrupt Routine. As the External Interrupt Routine is exited, the interrupt reset pulse is generated by microprocessor circuit 82 at signal line 255.

Figure 7:
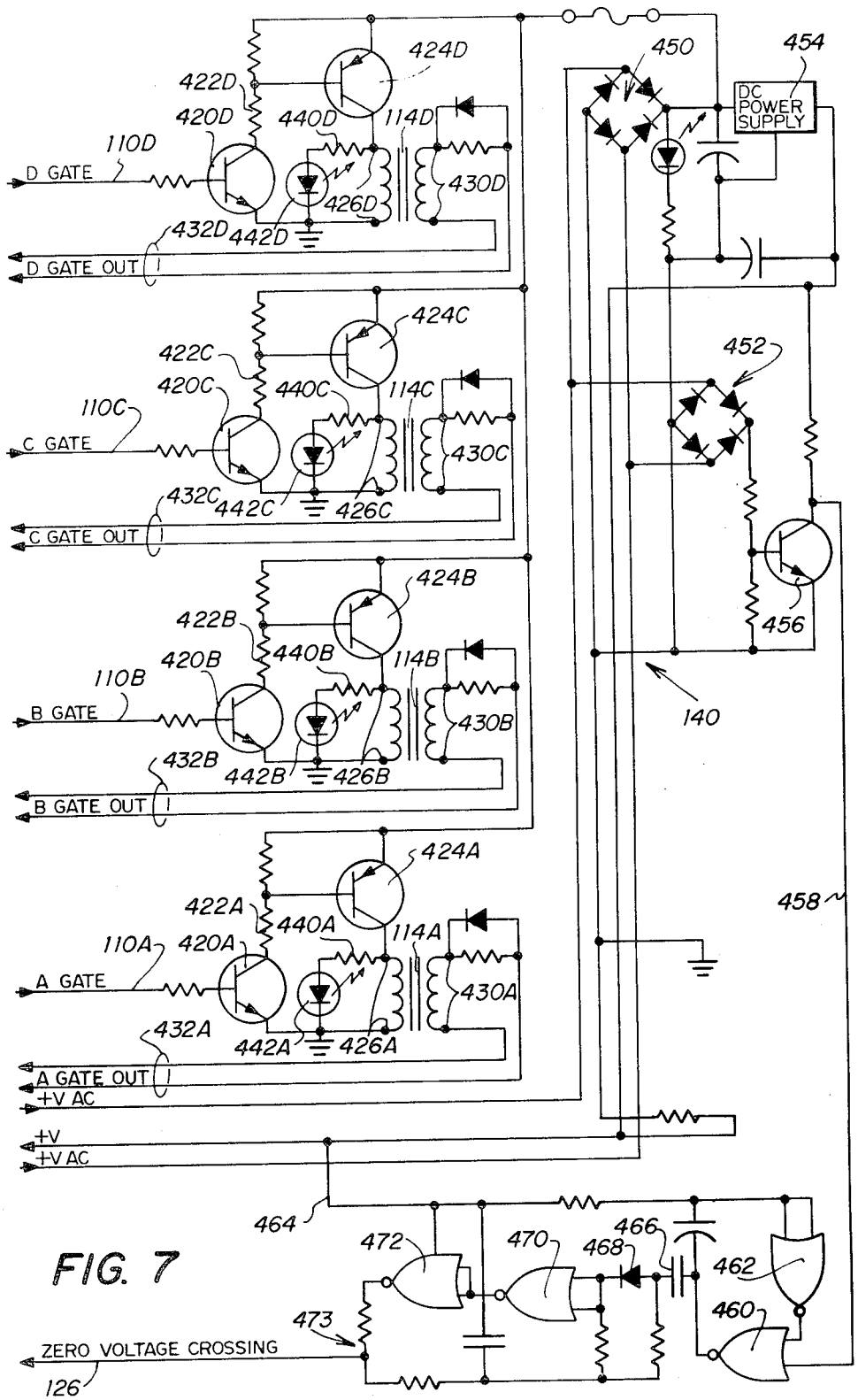
FIG. 7 is a detailed schematic diagram illustrating the power drivers shown in the block diagram of FIG. 3.

Referring to FIG. 7, the circuitry for each power driver 112 (FIG. 3) is illustrated and is identical. Therefore, only that circuitry for cooking area A will be described herein, the other circuit components being identified with like numerals. GATE signals generated at the outputs of AND gates 200, 206, 212 and 218 (FIG. 5) are applied via signal lines 110 to the base of transistors 420A-D. The output of the collector of transistors 420A is applied through a resistance 422A to the base of a transistor 424A. The output of transistor 424A is applied to input terminals 426A connected to transformer 114A (FIG. 3). The output of transformer 114A is applied from terminals 430A to generate the GATE OUT signal via signal lines 432A applied to inverters 116 (FIG. 3). The GATE OUT signals applied via signal lines 432 control the operation of induction heating coils 118 through inverters 116.

The output of transistor 424A is also applied through a resistance 440A to a light emitting diode 442A. Light emitting diode 442A becomes illuminated when gating pulses are being applied to induction heating coil 118A. Light emitting diode 442A may be viewed through an aperture formed in induction cook-top surface 40 to enable ease of repair and maintenance by indicating when the gating circuit is operating properly.

FIG. 7 also illustrates the circuitry corresponding to the power supply 140 (FIG. 3) utilized to generate the necessary voltages for the control circuitry of induction cook-top surface 40. Power supply 140 includes full-wave bridge rectifiers generally identified by the numerals 450 and 452 which receive AC voltage input signals. An output of full-wave voltage rectifier bridge 450 is applied to a DC power supply 454. The output of full-wave voltage rectifier bridge 452 is applied to the base of a transistor 456 whose output is applied via signal line 458 to a NOR gate 460. NOR gate 460 also receives as an input the output of NOR gate 462, which receives as an input via signal line 464 the output of DC power supply 454. The output of NOR gate 460 is coupled through a capacitor 466 and a diode 468 to a NOR gate 470 whose output is applied to a NOR gate 472. The output of NOR gate 472 is applied through a resistive voltage divider 473 to generate the ZERO VOLTAGE CROSSING signal via signal line 126 which is applied to AND gate 292 (FIG. 5).

In operation, the zero voltage crossing point of the AC line voltage is detected by transistor 456 which provides a narrow pulse coincident with the zero voltage crossing point. This narrow voltage pulse is stretched and inverted by NOR gates 460 and 462. The inverted pulse goes positive approximately three msec after the zero voltage crossing point. Capacitor 466 couples the dv/dt of the leading and trailing edges of the inverted pulse to diode 468 which eliminates the negative trailing edge pulse. The leading edge pulse is buffered by NOR gates 470 and 472 and level shifted by resistive voltage divider 473.

The ZERO VOLTAGE CROSSING signal applied via signal line 126 is utilized with microprocessor circuit 82 (FIG. 5) to insure that the GATE signals on signal lines 110 are always terminated at the same point with respect to the AC line voltage wave form. This termination is important in that voltage stress on the elements of the present invention are decreased and component failure is minimized without changing their nominal operating voltage levels. GATE signals are always terminated at the same point by anding the PHASE 1 timing signal of counter 270 with the ZERO VOLTAGE CROSSING signal in AND gate 292.

Failsafe circuitry insures that all GATE signals on signal lines 110 are terminated if the ZERO VOLTAGE CROSSING signal applied via signal line 126 fails to occur, from an abnormally high heat sink temperature, whether from loss of AC line voltage or from component failure. Again, referring to FIG. 5, the ZERO VOLTAGE CROSSING signal is applied to diode 306 which isolates the ZERO VOLTAGE CROSSING signal from the failsafe circuit and provides a path for charging a capacitor 308. Capacitor 308, when charged, applies a logic high through resistor 309 on the input to NOR gate 310 which acts as an inverter to cause a logic low to be applied to AND gate 290. AND gate 290 holds the reset input of counter 270 to a logic low. If more than two consecutive ZERO VOLTAGE CROSSING signals fail to occur, capacitor 308 will discharge sufficiently through resistor 309 to switch the output of NOR gate 310 to a logic high which is applied to AND gate 290. When PHASE 0 of counter 270 occurs, the reset input of counter 270 will go to a logic high, causing counter 270 to stay on PHASE 0 until the ZERO VOLTAGE CROSSING signal has been restored. When counter 270 is on a PHASE 0 timing signal, no GATE signals can occur on signal lines 110.

Figure 8:
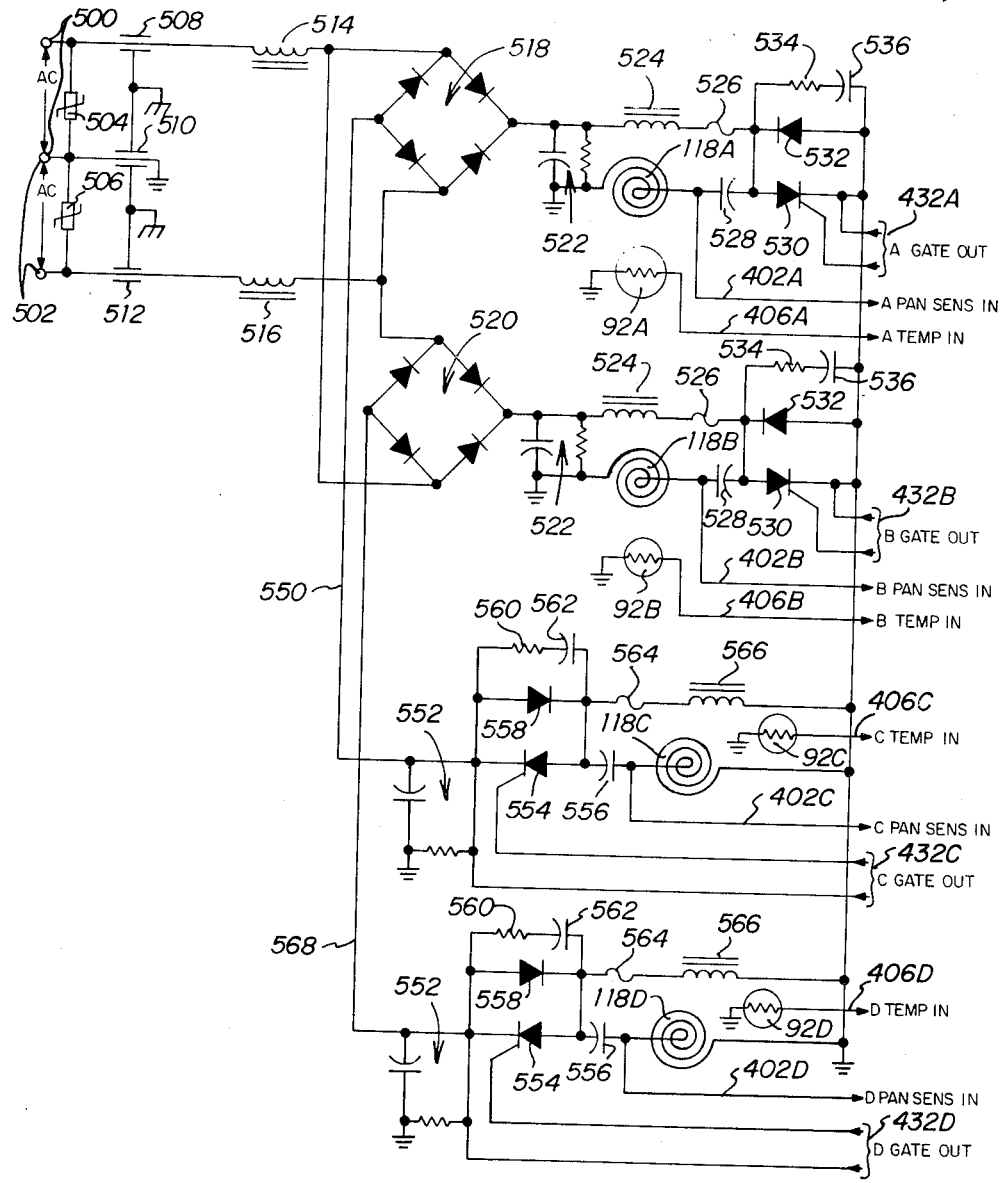
FIG. 8 is a detailed schematic diagram of the inverter and induction heating coil circuitry shown in the block diagram of FIG. 3.

Referring to FIG. 8, a schematic diagram of inverters 116 and induction heating coils 118 (FIG. 3) are illustrated. Wound induction heating coils 118 are designated A, B, C and D and correspond with cooking areas A, B, C and D previously shown in FIG. 1. For example, the induction heating coil 118A is disposed directly beneath surface 42 beneath cooking area A shown in FIG. 1. The control circuits for induction heating coils A and B are identical, while the control circuits for induction heating coils C and D are identical. As will subsequently be described, the control circuits for driving induction heating coils 118A and 118B are connected in an opposite manner to the control circuitry for driving induction heating coils 118C and D, in order to prevent ringing and overshooting in addition to providing safety features.

Positive and negative AC voltages are applied across terminal pairs 500 and 502. Metal oxide varistors 504 and 506 are connected across the input AC voltage lines, along with capacitors 508, 510 and 512. Inductors 514 and 516 are connected in series with the input AC voltage lines and are each connected at opposite points to full-wave bridge rectifiers generally identified by the numerals 518 and 520 comprised of four diodes and connected in the well known manner.

Bridge rectifier 518 is connected to a resistor-capacitor network 522 which is connected to the outer terminal of induction heating coil 118A. Resistor-capacitor network 522 is connected to circuit ground. The output of bridge rectifier 518 is also connected to an inductor 524 which is connected in series with a fuse 526 across induction heating coil 118A. The center terminal of induction heating coil 118A is connected to a capacitor 528 which is connected to the anode of a silicon controlled rectifier (SCR) 530. The gate and the cathode terminals of SCR 530 receive the A GATE OUT signal via signal line 432A from transformer 114 (FIG. 7). The cathode terminal of SCR 530 is also connected to AC circuit ground. A diode 532 is connected across the anode and cathode terminals of SCR 530. A resistor 534 and a capacitor 536 are connected in series across diode 532.

Temperature sensor 92A comprises a heat sensitive thermistor and is placed in proximity to induction heating coil 118A. One terminal of thermistor 92A is connected to circuit ground, while the other terminal of thermistor 92A is connected via signal line 406A to apply the A TEMP IN signal to amplifier 408A (FIG. 6). The A TEMP IN signal causes the generation of the A TEMP SENS signal which is applied to inverter 230 (FIG. 5) to ultimately cause induction heating coil 118A to be turned off if a maximum safe operating temperature is exceeded, such as would occur if a cooking utensil boiled dry.

The operation of SCR 530 and induction heating coil 118A of the present invention will now be discussed. Full-wave bridge rectifier 518 applies a DC voltage for suitable biasing. Gating signals, A GATE OUT, are applied from transformer 114A described in FIG. 7 to the gate terminal of SCR 530. The series resistor-capacitor circuit, including resistor 534 and capacitor 536, is provided for dv/dt protection to limit the rate of reapplication of forward voltage to SCR 530. The power circuit of the present invention further includes the commutating capacitor 528 and the induction heating coil 118A.

Upon application of a gating pulse from transformer 114A via signal lines 432A, a cycle of current flow is initiated, wherein induction heating coil 118A and commutating capacitor 528 form a series resonant circuit for generating damped sinusoidal current pulses that flow through induction heating coil 118A. Inductor 524 serves to reset commutating capacitor 528 by charging capacitor 528 positively. The gating pulse is applied from transformer 114A via signal lines 432A to control the amount of heat generated by induction heating coil 118A.

A cooking pan set adjacent induction heating coil 118A changes the resonance and the Q of the inverter circuit 116. The induction heating coil 118A functions as the primary winding of an air-core transformer. The cooking pan provides an inductance which forms a part of the total inductance of the high frequency resonant circuit of SCR 530. The commutating capacitor 528 and induction heating coil 118A comprise a resonant circuit which is tuned to the desired resonant frequency to provide the desired operating range, which is generally within the range of 18 KHz to 40 KHz.

It will be understood that when a cooking utensil is removed from adjacent induction heating coil 118A, the total effective inductance of the system changes and therefore a change in the resonant frequency of the series resonant circuit is provided. This change of resonant frequency is directly sensed through signal line 402A which generates the A PAN SENS IN signal applied to transistor 404A (FIG. 6) to ultimately generate the PAN SENS A signal applied to inverter 350 (FIG. 5) to indicate the removal of the pan.

The interconnection of induction heating coils 118A and 118B to circuit ground prevents the presence of DC voltage from full-wave voltage rectifier bridges 518 and 520 from being applied to surface 42 of cook-top surface 40 should surface 42 be damaged and induction heating coils 118A and 118B be exposed to the operator. It can be seen that through this configuration, the voltage applied from full-wave voltage rectifier bridges 518 and 520 is applied to inductor 524 rather than directly to induction heating coils 118A and 118B.

While the above discussion has been specifically related to induction heating coil 118A, it will be understood that the circuitry interconnected to induction heating coil 118B functions similarly. The corresponding components are identified with like reference numerals.

For more detail on the construction and general operation of this general type of inverter using an SCR, reference is made to co-pending U.S. Patent Application Ser. No. 819,169 and an article entitled "A Low Cost, Ultra-Sonic Frequency Inverter Using a Single SCR" by Neville Mapham, Application Note published by Semiconductor Products Department of General Electric Company, Number 20049, published February 1967. For a description of the use of an SCR inverter circuit with an induction heating system, reference is made to U.S. Pat. No. 3,637,970 issued to Cunningham on Jan. 25, 1972 and entitled "Induction Heating Apparatus"; U.S. Pat. No. 3,697,716 issued to Kornrumpf on Oct. 10, 1972 and entitled "Induction Cooking Power Converter with Improved Coil Position"; and U.S. Pat. No. 3,823,297 issued to Cunningham on July 9, 1974 and entitled "Load Controlled Induction Heating".

Induction heating coil 118C includes inverter circuitry which is essentially a mirror image of the previously described circuitry with respect to induction heating coils 118A and 118B. DC voltage is applied to the inverter from full-wave voltage rectifier bridge 518 via signal line 550. A resistor-capacitor network 552 is connected between signal line 550 and circuit ground. An SCR 554 is connected in series with a commutating capacitor 556 which is connected to the center lead of induction heating coil 118C. The cathode terminal of SCR 554 is connected to AC circuit ground through the resistor-capacitor network 552. A diode 558 is connected across the anode and cathode terminals of SCR 554, and a resistor 560 and a capacitor 562 are connected in series across diode 558. A fuse 564 is connected in series with an inductor 566 across commutating capacitor 556 and induction heating coil 118C. Temperature sensor 92 in the form of a thermistor 92C is disposed adjacent induction heating coil 118C to provide an overheating electrical indication in the form of the C TEMP IN signal applied via signal line 406C to comparator 408C (FIG. 6). Gating signals are applied from transformer 114C via signal lines 432C to the gate and cathode terminals of SCR 554.

The inverter circuitry associated with induction heating coil 118D is identical to that shown and described with respect to induction heating coil 118C, and will thus not be described in detail.

SCRs 530 and induction heating coils 118A and 118B are connected in a mirror image configuration with respect to SCRs 554 and induction heating coils 118C and 118D. This mirror interconnection has been found to substantially eliminate ringing and overshoot associated with the GATE signals applied via signal lines 110 to inverters 116 (FIG. 3) when a positive power supply is utilized. It is necessary, according to the present system, to use both positive and negative AC power supplies to obtain a balanced load. With such positive and negative power supplies, it has been found that if all inverters 116 (FIG. 3) and induction heating coils 118 are connected in an identical manner, that severe cross talk and ringing can occur. The present mirror image connection maintains the cathode terminal of each of SCRs 530 and 554 at AC circuit ground potential, eliminates floating SCR cathode terminals and thus eliminates cross talk and ringing during operation of the system.

Figure 9:
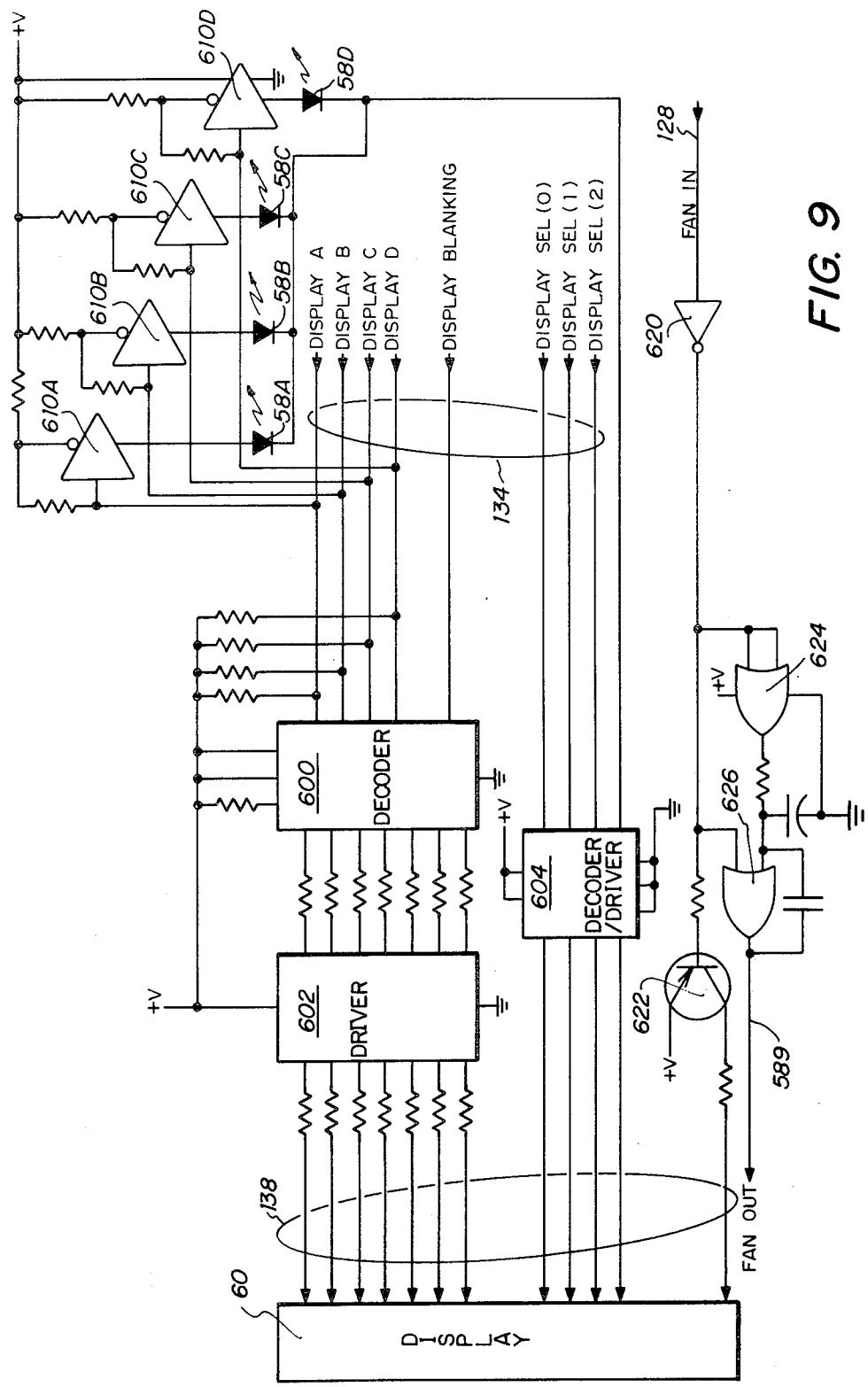
FIG. 9 is a detailed schematic diagram illustrating the display and display drivers shown in the block diagram of FIG. 3.

Referring to FIG. 9, the electronic circuitry corresponding to display drivers 136 and display 60 (FIG. 3) is illustrated. The DISPLAY A, B, C and D signals are applied from microprocessor circuit 82 via signal lines 134 to a decoder 600. Decoder 600 may comprise, for example, a DS8880 I/C. The output of decoder 600 is applied to a driver 602 whose output is applied via signal lines 138 to display 60. Driver 602 may comprise, for example, a ULN2033A I/C. Decoder 600 also receives the DISPLAY BLANKING signal applied via signal 134 from the output of NOR gate 312 (FIG. 5).

The DISPLAY SELECT 0, 1 and 2 signals are applied from microprocessor circuit 82 (FIG. 5) via signal lines 134 to a decoder/driver 604. Decoder/driver 604 may comprise, for example, an NE590 I/C whose output is applied via signal lines 138 to display 60. Display 60 is a four-digit, seven-segment display and may comprise, for example, Model TIL834 manufactured and sold by Texas Instruments, Inc.

The DISPLAY A, B, C and D signals generated by microprocessor circuit 82 (FIG. 5) are also applied via signal lines 134 to drivers 610. The outputs of drivers 610 are applied to status display indicators 58 which are illuminated to indicate that a cooking area A-D is actuated and which will flash to indicate that a cooking utensil has been removed from a cooking area A-D. Status display indicators 58 may comprise, for example, light emitting diodes. The cathodes of light emitting diodes 58 are applied to decoder/driver 604.

The FAN IN signal is applied via signal line 128 from microprocessor circuit 82 (FIG. 5) through an inverter 620 to the base of a transistor 622. The output of transistor 626 generates the ":" of display 60 for the time of day display. The FAN IN signal is also applied to OR gates 624 and 626 to generate the FAN OUT signal via signal line 589 applied to inverter 590 (FIG. 9). The FAN OUT signal applied to fan 132 causes fan 132 to operate when UNLOCK TOUCH CONTROL PAD 52 (FIG. 1) is touched and is deactivated after all cooking areas A-D have been turned off. Fan 132 continues to operate for a predetermined time, such as several minutes after all cooking area A-D have been turned off.

Figure 10:
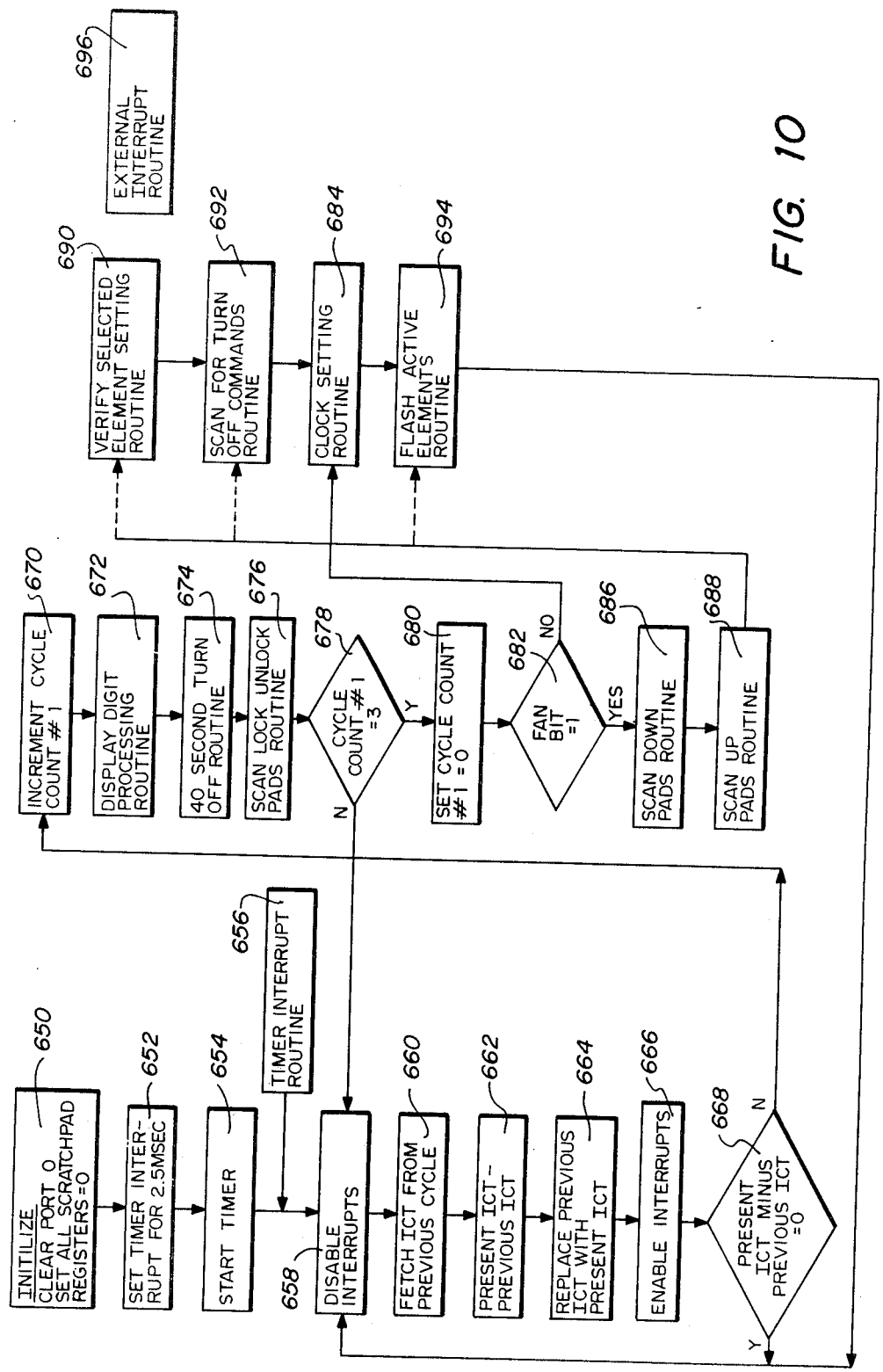
FIG. 10 is a software flow diagram of the basic system program for the microprocessor shown in the block diagram of FIG. 3.

Referring to FIG. 10, the software flow diagram for the basic program architecture of microprocessor circuit 82 (FIG. 3) is illustrated. Microprocessor circuit 82 is initialized at block 650 by clearing port 0 and setting all scratch pad registers to zero. At block 652, the internal timer of microprocessor circuit 82 is set to provide a timer interrupt every 2.5 milliseconds. The 2.5 millisecond timer is used for deriving all timing signals generated by microprocessor circuit 82. After the timer interrupt is set at block 652, the timer of microprocessor circuit 82 is started at block 654. The timer of microprocessor circuit 82 provides a timer interrupt every 2.5 milliseconds thereafter to bring the program to the address of the Timer Interrupt Routine block 656. The Timer Interrupt Routine will be subsequently described in connection with the software flow diagram of FIG. 11.

After the Timer Interrupt Routine 656 is executed, it is necessary to disable microprocessor circuit 82 from receiving any external interrupts while the interrupt count (ICT) is tested to determine if it has been incremented during the last Timer Interrupt Routine. This function is performed by the disable interrupts block 658. After the external interrupts are disabled at block 658, the software fetches the interrupt count (ICT) from the previous cycle at block 660. The ICT is the timer interrupt count which counts the number of times the program has received twenty timer interrupts from Timer Interrupt Routine 656. The ICT ranges from zero to ninety-nine and also serves the function of controlling the duty cycle for induction heating coils 118 (FIG. 3).

An ICT occurs every 50 milliseconds in the preferred embodiment of the present invention and is derived from the 2.5 millisecond timer interrupt by counting timer interrupts zero to nineteen. Testing to determine if the ICT has been incremented is accomplished by blocks 660-668. Block 662 subtracts the previous ICT count from the present ICT count. In block 664, the previous ICT count is replaced with the present ICT. After the present and previous ICTs have been compared, the interrupts are enabled at block 666. At block 668, a decision is made as to whether the present ICT count minus the previous ICT count equals zero. If the result is yes, the flow returns to the disable interrupts block 658. This loop continues until the result of block 668 is not zero, indicating that the ICT has been incremented, which occurs every 50 milliseconds.

If the present ICT count minus the previous ICT count does not equal zero, the continuous loop between decision blocks 668 and 658 is escaped and the cycle count number one is incremented at block 670. The cycle count number one ranges from zero to three and serves to spread the functions of microprocessor circuit 82 more evenly over each operating cycle. Each one of the cycle counts represents 50 milliseconds and as soon as the cycle count has been incremented, the Display Digit Processing Routine is entered at 672. Display Digit Processing Routine 672 will be further described in the software flow diagram of FIG. 15. At the completion of Display Digit Processing Routine 672, the Forty Second Turnoff Routine is entered at block 674. The Forty Second Turnoff Routine 674 is utilized to control whether an induction heating coil 118 (FIG. 3) is turned off when a pan has been removed from adjacent an induction heating coil 118 for forty seconds. Forty Second Turnoff Routine 674 will be described in connection with the software flow diagram of FIG. 16.

At the completion of the Forty Second Turnoff Routine 674, the flow enters the Scan Lock and Unlock Pads Routine 676 which will be described in connection with FIG. 17. The scanning of the LOCK TOUCH CONTROL PAD 50 and UNLOCK TOUCH CONTROL PAD 52 (FIG. 3) occurs every 50 milliseconds and functions to determine whether or not the operator has activated either the LOCK TOUCH CONTROL PAD 50 or the UNLOCK TOUCH CONTROL PAD 52 (FIG. 3). At the completion of the Scan Lock and Unlock Pad Routine 676, if the cycle count number one does not equal three at decision block 678, the flow returns to the disable interrupt block 658. If the cycle count number one does equal three, the cycle count is reinitialized to zero at block 680.

After initializing the cycle count number one to zero, a decision is made at block 682 as to whether the fan bit equals one. If the fan bit does not equal one, this indicates that cook-top surface 40 is off and the program flow continues to the Clock Setting Routine 684 to be subsequently described in connection with the software flow diagram of FIG. 22. The Clock Setting Routine 684 permits the setting of the time of day clock of display 60 (FIG. 1) only when cook-top surface 40 is off. If the fan bit does equal one, indicating that the cook-top surface 40 is on, the software flow continues to the Scan Down Pads Routine 686. The Scan Down Pads Routine 686 will be subsequently described in connection with the software flow diagram of FIG. 18.

Following the scanning of the LOW TOUCH CONTROL PADS 58 by the Scan Down Pads Routine, the HI TOUCH CONTROL PADS 56 are scanned by the Scan Up Pads Routine at block 688. The Scan Up Pads Routine 688 will be subsequently described in connection with the software flow diagram of FIG. 19. At the completion of the Scan Up Pads Routine 688, depending upon the conditions present, this program can branch to one of three different routines. These three branches include the Verify Selected Element Setting Routine at block 690. The Verify Selected Element Setting Routine 690 will be described in connection with the software flow diagram of FIG. 20. The second branch which the Scan Up Pads Routine 688 can flow to is the Scan For Turnoff Commands Routine 692 which will subsequently be described in connection with the software flow diagram of FIG. 21. The third branch which the Scan Up Pads Routine 688 may flow to is the Flash Active Elements Routine 694 which will subsequently be described in connection with the software flow diagram of FIG. 23. If the Verify Selected Elements Setting Routine 690 branches to the Scan Up Pads Routine 688, the Scan For Turnoff Commands Routine 692, Clock Setting Routine 684 and Flash Active Elements Routine 694 will be performed. Similarly, if the program flow from Scan Up Pads Routine 688 continues to the Scan For Turnoff Commands Routine 692, the Clock Setting Routine 684 and Flash Active Elements Routine 694 will both be performed.

The Flash Active Elements Routine 694 establishes the flashing of the status display indicators 58 (FIG. 1). At the completion of the Flash Active Elements Routine 694, the flow returns to the disable interrupts block 658 to wait for the next execution of the Timer Interrupt Routine 656.

The External Interrupt Routine 696 is independent of the loop previously described and is completely independent of the previously mentioned routines. The External Interrupt Routine 696 will be subsequently described in connection with FIG. 24. At any time an interrupt is enabled, it is possible for microprocessor circuit 82 to receive an external interrupt in the form of a temperature sensor interrupt or pan sensor interrupt. The External Interrupt Routine 696 progresses independent of the other routines.

Figure 11:
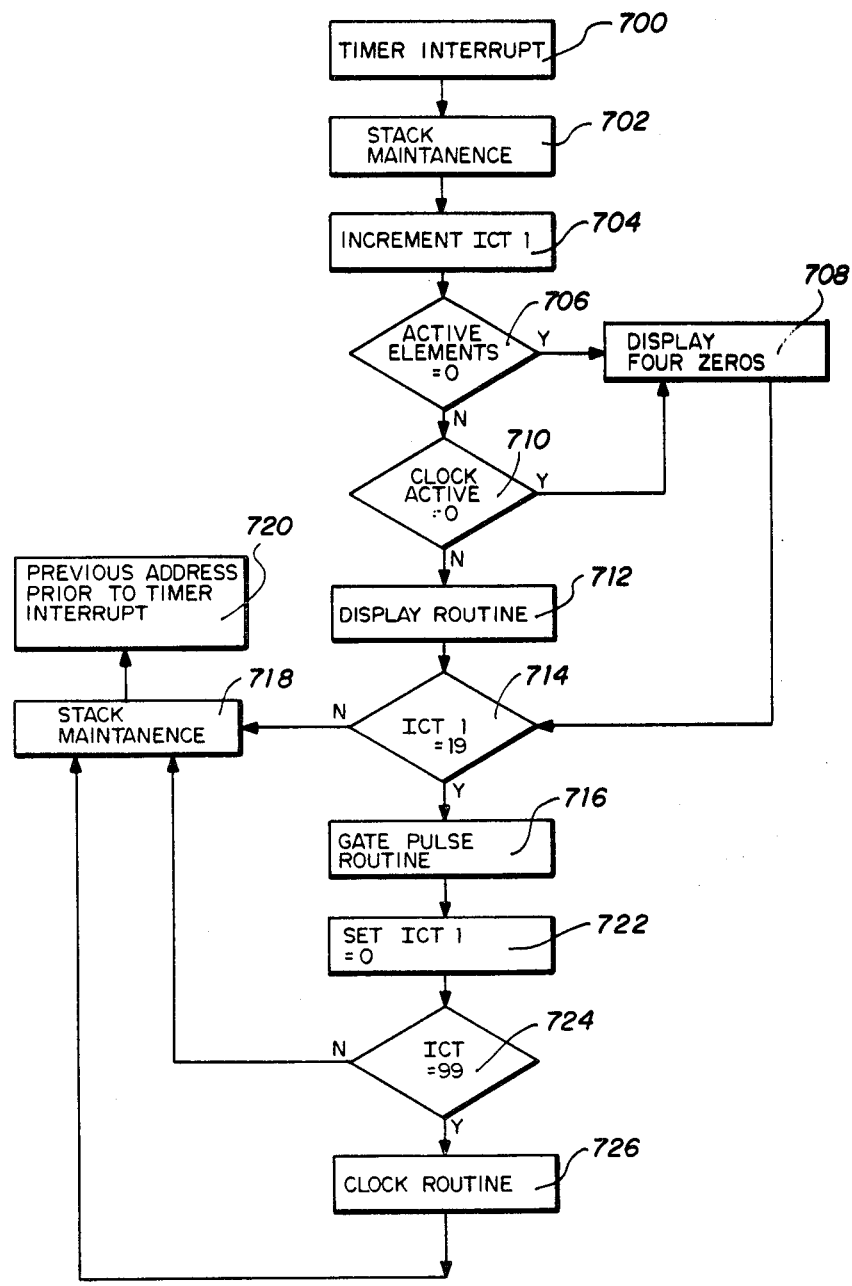
FIG. 11 is a software flow diagram of the Timer Interrupt Routine.

Referring to FIG. 11, the Timer Interrupt Routine 656 is illustrated. At the occurrence of a timer interrupt at block 700, the stack maintenance 702 is entered. The stack maintenance 702 comprises a software stack for preserving the point at which the main program has been exited at the time of receipt of a timer interrupt so that the program can return to this same point in the program after completion of the Timer Interrupt Routine 656. The Timer Interrupt Routine 656 commences by incrementing the interrupt count 1 (ICT 1) which is the 2.5 millisecond, zero to nineteen function. After the ICT 1 is incremented, a decision is made at decision block 706 as to whether cook-top surface 40 is active.

After power is initially applied, if cook-top surface 40 is not activated or if the clock is not set, display 60 (FIG. 1) displays four zeros. Therefore, if the decision at block 706 is yes, meaning that there were no active induction heating coils 118, then the flow branches to the display four zeros block 708. If active induction heating coils 118 were present, the no branch of active element equal zero block 706 is taken to the clock active equal zero decision block 710. The clock active equal zero block 710 determines whether the clock is active. If the clock is active or if an induction heating coil 118 has been turned on, the program continues to the Display Routine 712; otherwise, the program returns to the display four zeros block 708. The Display Routine 712 will be subsequently described in connection with the software flow diagram of FIG. 12. Display Routine 712 generates the four digits of the seven-segment display 60 (FIG. 1).

At the completion of Display Routine 712, a determination is made at block 714 as to whether the ICT 1 count equals 19. If the decision is yes, the flow continues to the Gate Pulse Routine 716 which will subsequently be described in connection with the software flow diagram of FIG. 13. If the ICT 1 count does not equal 19, the Timer Interrupt Routine 656 is exited through stack maintenance 718 to the previous address prior to entry into Timer Interrupt Routine 656 at block 720. If the count of ICT 1 does equal 19, this indicates that the 50 millisecond time period has occurred to require execution of the Gate Pulse Routine at block 716.

At the completion of the Gate Pulse Routine 716, the ICT 1 count is reset to zero at block 722. At block 724, a decision is made as to whether the ICT count equals 99 which is the completion of the five second timing interval. If ICT count does not equal 99, the Timer Interrupt Routine 656 branches to the stack maintenance 718 and to the previous address at block 720. If ICT count does equal 99, this indicates that five seconds have elapsed and the Clock Routine is entered at block 726. The Clock Routine increments the real time clock at five second intervals. Clock Routine 726 will be subsequently described in connection with the software flow diagram of FIG. 14. At the completion of Clock Routine 726, the Timer Interrupt Routine 656 exits through the stack maintenance 718 to the previous address at block 720.

Figure 12:
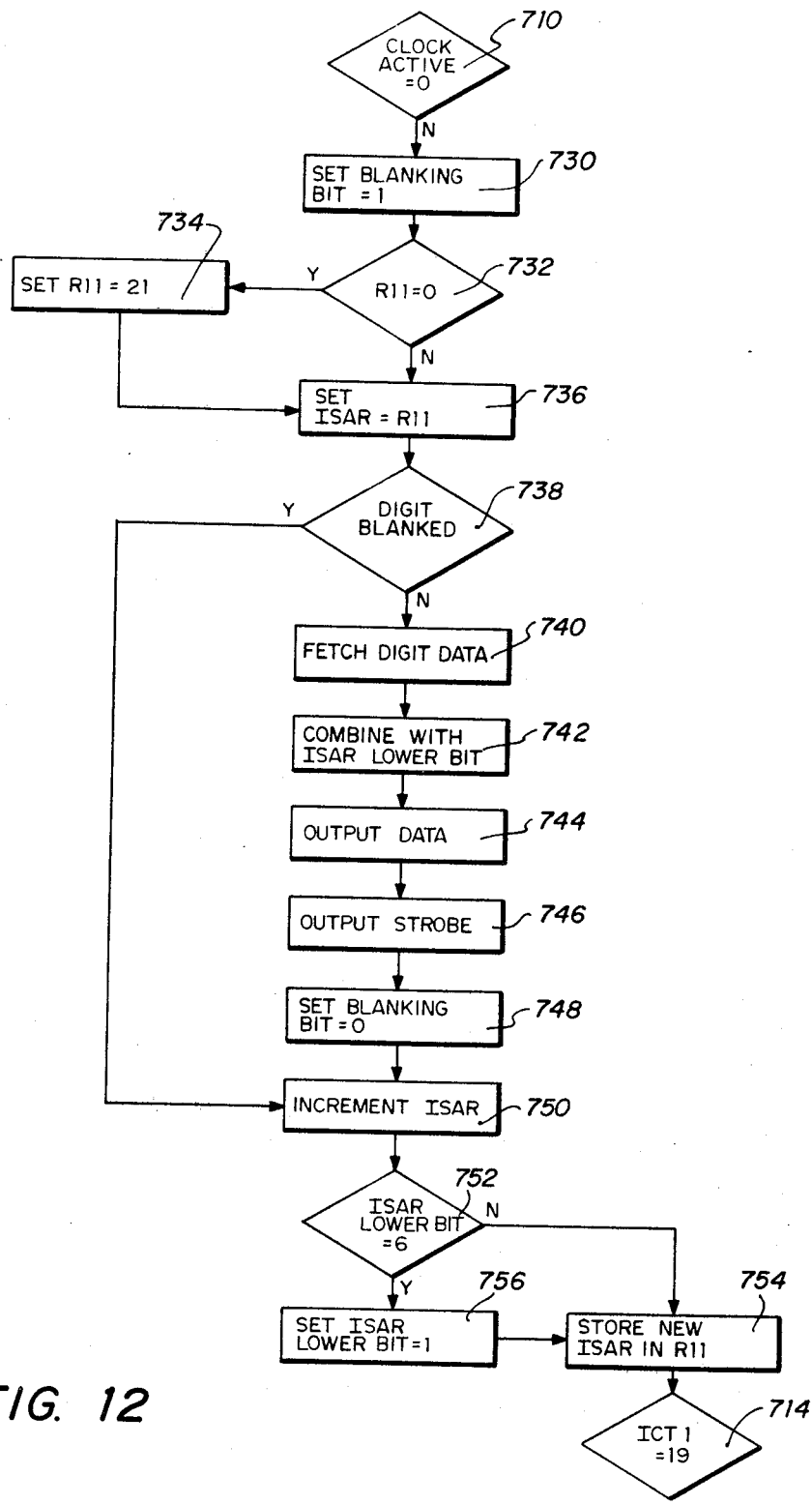
FIG. 12 is a software flow diagram of the Display Routine.

Referring to FIG. 12, the Display Routine 712 (FIG. 11) is illustrated. Display Routine 712 functions to output the display information to display 60 (FIG. 1). Initially, the blanking bit is set to a one at block 730 and an output digit command and data for that digit is output. Each time Display Routine 712 is performed, one digit of display 60 is displayed. If the contents of a register R11 equals zero at decision block 732, then the contents of register R11 is set to 21 at block 734. After setting the contents of register R11 at block 734 or if the contents of register R11 is not equal to zero, the Display Routine 712 continues to set an internal register ISAR at block 736 equal to the contents of register R11.

At block 738, it is determined whether a digit is blanked. If a digit is not blanked at decision block 738, the digit data is fetched at block 740 and is combined at block 742 with the lower bits of the ISAR register. Data is then output at block 744 and the strobe is output at block 746. The blanking bit is then set to zero at block 748 and the ISAR register is incremented at block 750. Had the decision at decision block 738 been yes, the flow would have continued from block 738 to block 750.

At the completion of the incrementation of the ISAR register, a decision is made at block 752 as to whether the lower bits of the ISAR register equals 6. If the decision is no, the contents of the ISAR register are then stored in register R11 and the program exits to block 714 (FIG. 11). If the decision at block 752 is yes, the lower bits of ISAR register are set equal to one and the program continues through block 754 to block 714.

Figure 13:
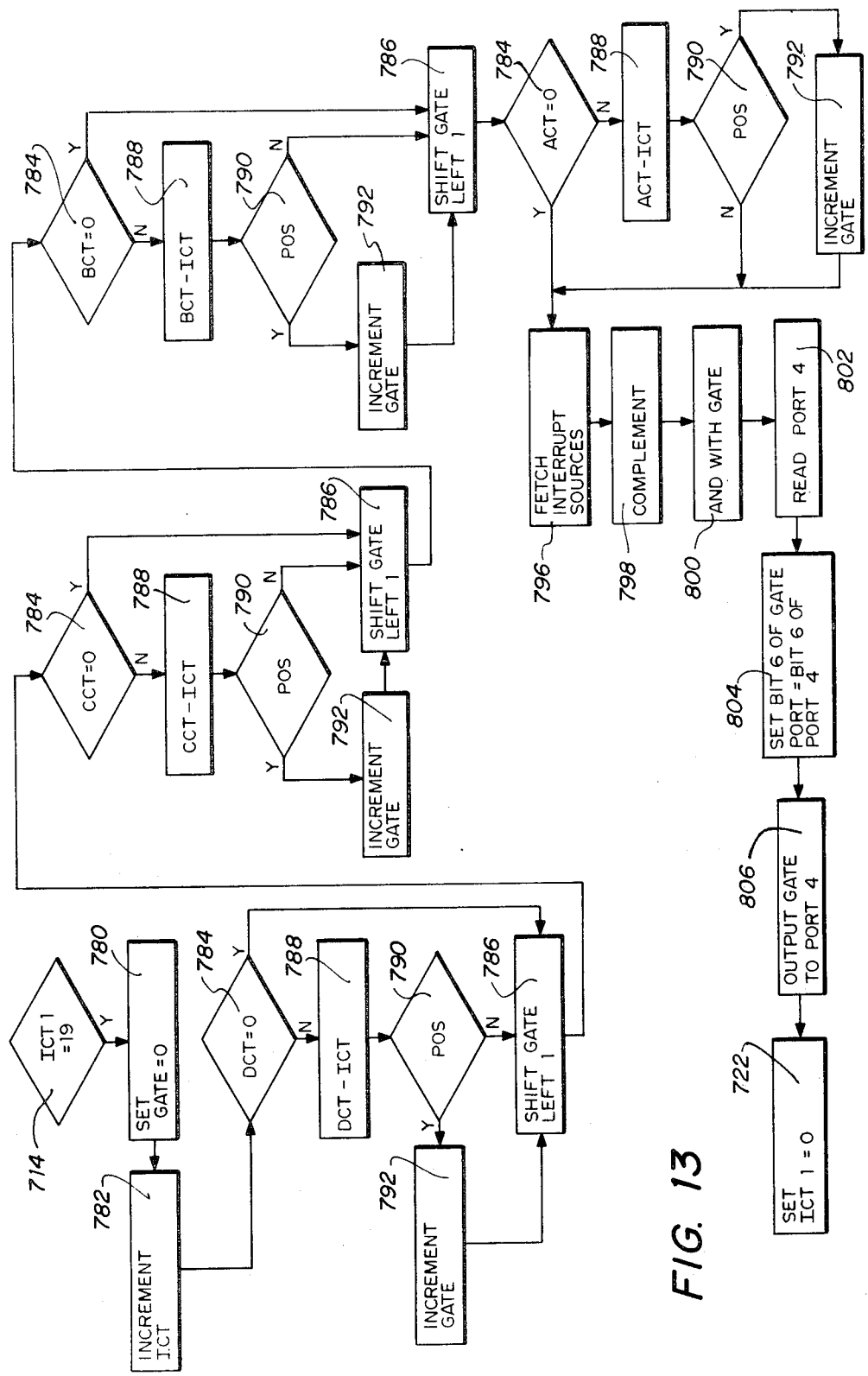
FIG. 13 is a software flow diagram of the Gate Pulse Routine.

Referring to FIG. 13, the Gate Pulse Routine 716 (FIG. 11) is illustrated. If the decision at decision block 714 (FIG. 11) is yes, Gate Pulse Routine 716 is entered. Initially, at block 780, the gate word is set to zero and the ICT count is incremented at block 782. The ICT count range is from zero to 99. The DCT count is then checked at decision block 784. The DCT count is that count for the duty cycle of the induction heating coil 118D (FIG. 3). Each induction heating coil 118 has an independent duty cycle controlled by a count, for example, induction heating coil 118C is controlled by the CCT count, induction heating coil 118B is controlled by the BCT count and induction heating coil 118A is controlled by the ACT count. These counts vary from zero to 99, which is the duty cycle of the particular induction heating coil 118. The software of the Gate Pulse Routine 716 is identical for each induction heating coil 118A-D and common reference numerals will be utilized for common functions; however, reference will be made to the induction heating coil 118D in the discussion herein.

If the decision at decision block 784 is that the DCT count equals zero, meaning that induction heating coil 118D is off, the gate word is shifted left one position at block 786 to set the D bit to zero. If DCT count does not equal zero at 784, block 788 is entered to subtract the ICT count from the DCT count to determine whether induction heating coil 118D should be on or off. If the interrupt count, ICT, is zero and any of induction heating coils 118 are on, the result of the subtraction at block 788 will be positive as determined at decision block 790. However, if for example, induction heating coil 118D was set to 50 and the ICT count was 51, a negative result at decision block 790 would occur, indicating that the gate signals to induction heating coil 118D should be turned off.

If a positive result at decision block 790 is received, the gate is incremented at block 792 which indicates that the gate is to be on and sets the gate bit to a one. The output of increment gate block 792 is then applied to the shift gate left one block 786. The gate word is carried through the program associated with each induction heating coil 118 such that each time an induction heating coil 118 is not on, the program shifts the gate left one and assigns a zero to that bit. When the program is completed, the gate word has the lower four bits either a zero or a one. The least significant bit is the A induction heating coil 118 and bit 3; the most significant of the lower four bits is the D induction heating coil 118. Depending upon which of these bits is a zero or a one, each gate output is either on or off, zero being off and a one being on.

After the gates of induction heating coil 118A-D have been set to a one or a zero at blocks 786 and 792, the interrupt sources are fetched at block 796. The word fetched has the lower order four bits being a zero or a one depending on whether or not an interrupt was received on a particular induction heating coil 118. If a one is present in any of the four bits, an induction heating coil 118 has had an interrupt and it is desired to maintain this induction heating coil 118 in the off condition by outputting a zero gate bit to the particular induction heating coil 118 having the interrupt. By fetching the interrupt word at block 796, taking its complement at block 798 and anding the complement with the gate word at block 800, had a one been present in a gate bit, a zero is now present. For example, if induction heating coil 118A was on, it would have a 1 in the least significant bit, but if the interrupt source had a one for that bit, the program would drop the one and a zero would be applied to port 4 bit 0 at block 802 so that a high is not output to bit 0 of port 4 of microprocessor circuit 82 which is the gate port. At block 804, bit 6 of the gate word is set equal to bit 6 of port 4 of microprocessor circuit 82 to maintain the fan bit on. The contents of port 4 are then output at block 806 and the Gate Pulse Routine 716 returns to the set ICT 1 equals zero block 722 (FIG. 11).

Figure 14:
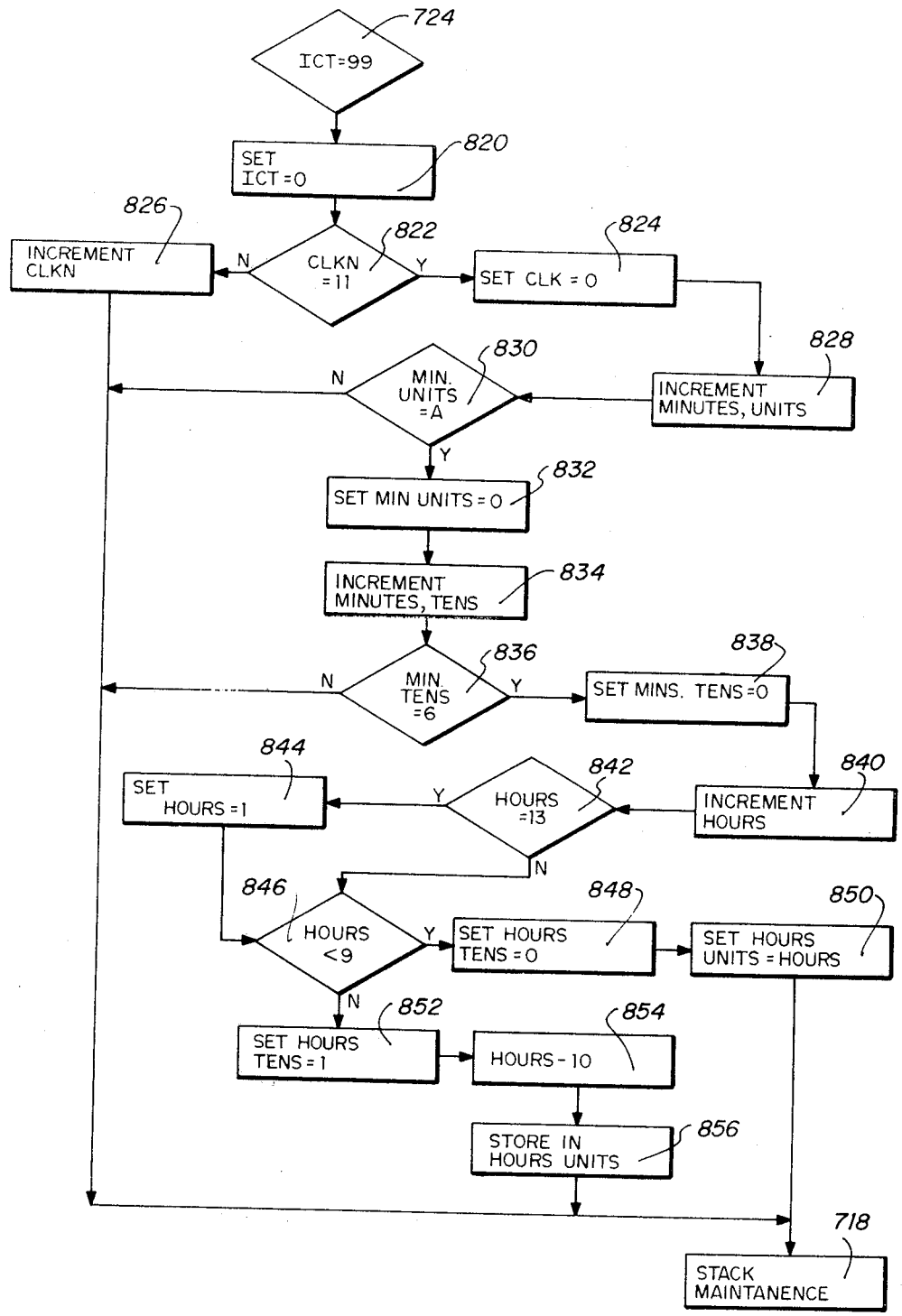
FIG. 14 is a software flow diagram of the Clock Routine.

Referring to FIG. 14, the Clock Routine 726 (FIG. 11) is illustrated. The function of Clock Routine 726 is to maintain the real time clock which is stored in registers of microprocessor circuit 82. Each time the ICT count equals 99 at block 724 (FIG. 11), this indicates that 5 seconds have elapsed, and Clock Routine 726 is entered at block 820. Block 820 sets the ICT count equal to zero and a determination is made at block 822 as to whether the contents of the clock number (CLKN) register is equal to 11. The number in the clock number register ranges from zero to 11 to include 12 counts wherein each count represents 5 seconds such that the yes output of block 822 represents a period of time equal to one minute. When one minute has elapsed, the clock register is set to zero at block 824. If a minute has not elapsed, the decision at block 822 is no and the clock number is incremented at block 826 and Clock Routine 726 is exited through stack maintenance 718 (FIG. 11) to exit the Timer Interrupt Routine 656 (FIG. 11).

After setting the clock number to zero at block 824, the minutes units are incremented at block 828. A decision is made at block 830 to perform a conversion from hexadecimal to binary coded decimal if the minutes units is equal to A. If the minutes units is equal to A, the minutes units are set to zero at block 832 and minutes tens is incremented at block 834. A decision is made at block 836 to determine if 6 blocks of 10 minutes have elasped representing one hour of time. If the decision is yes, the minutes tens unit register is reset to zero at block 838 and the hours are incremented at block 840. The hexadecimal contents of the hours register is then converted to A 1-to-12 binary coded decimal format by blocks 842-856. At the completion of Clock Routine 726, stack maintenance 718 places the program in the normal flow of the microprocessor circuit 82 main program which next performs the Display Digit Processing Routine 672 (FIG. 10).

Figure 15:
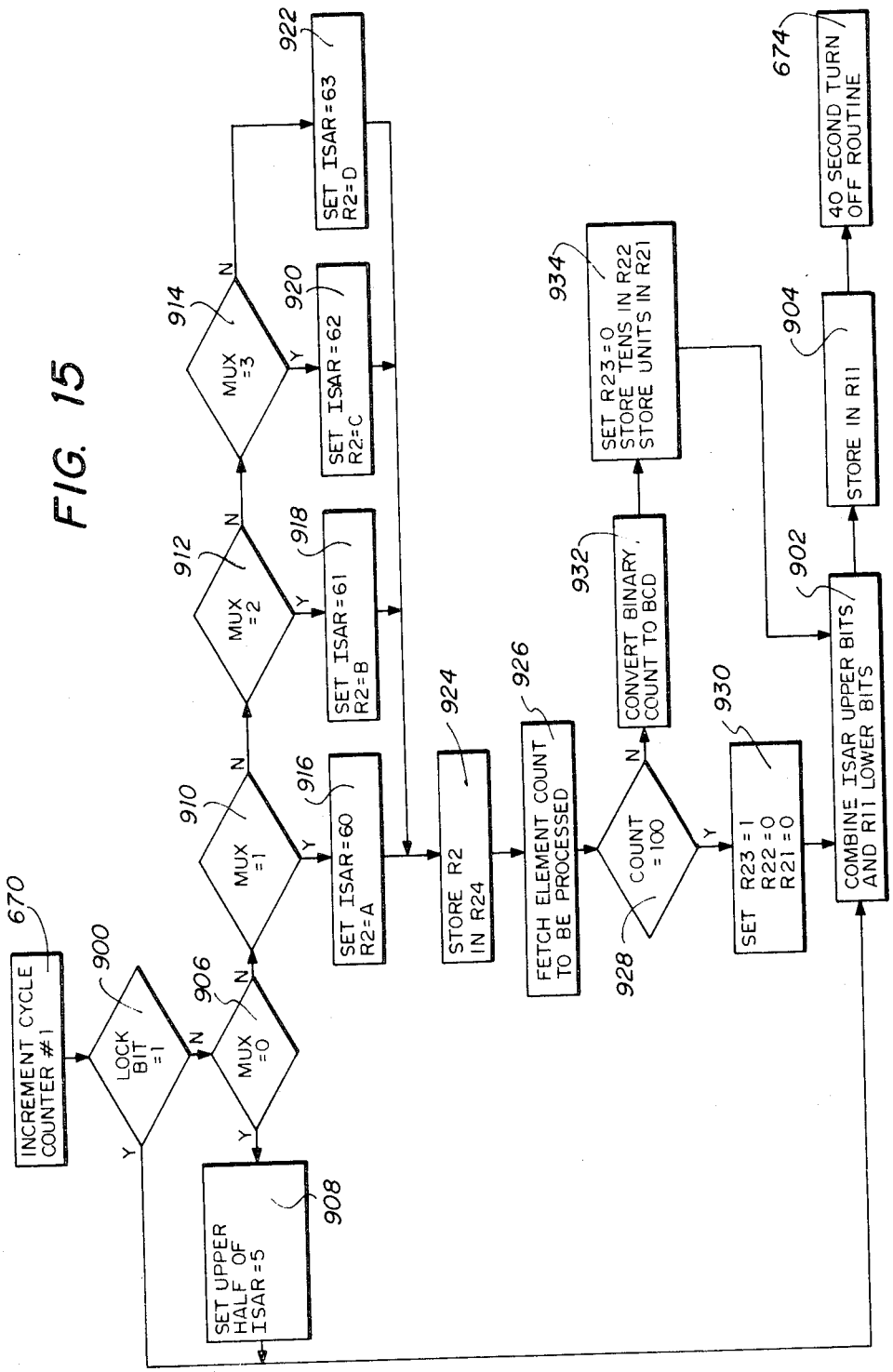
FIG. 15 is a software flow diagram of the Display Digit Processing Routine.

Referring to FIG. 15, the software for the Display Digit Processing Routine 672 is illustrated. After the cycle count number one has been incremented at 670, the Display Digit Processing Routine 672 is entered at decision block 900. A decision is made to determine whether the lock bit equals a one at block 900. If the lock bit equals a one, Display Digit Processing Routine 672 is exited by combining the ISAR register upper bits with the R11 register lower bits at block 902 which are then stored in register R11 at block 904 to exit Display Digit Processing Routine 672 to the Forty Second Turnoff Routine 674 (FIG. 10). If the lock bit equals a one, Digit Display Processing Routine 672 is bypassed because cook-top surface 40 is locked and the display 60 cannot be changed. Display Digit Processing Routine 672 is performed to maintain the display data of display 60 current.

If the decision at block 900 is that the lock bit is not equal to a one, being not locked, a decision is made at block 906 to determine if the contents of the MUX register is a zero. If the MUX register is a zero, this indicates that display 60 is displaying the time of day. In such instance, the upper bits of ISAR register are set to 5 at block 908 to access page 5 of the scratch pad registers of microprocessor circuit 82 where the clock data is stored. After setting the upper bits of the ISAR register at block 908, the Display Digit Processing Routine 672 is exited through block 902.

If the decision at block 906 is no, MUX register will have a one in one of the lower four order bits. These low order four bits determine which heating level of the four induction heating coils 118 will be displayed. The contents of the MUX register are then tested to determine whether the multiplex word has a 1 in bit 0, 1, 2 or 3 at decision blocks 910, 912 and 914. If the decision at block 914 is no, the multiplex word is equal to 3. Depending on the results of decision blocks 910, 912, and 914, an ISAR register R2 is set to an A, B, C or D depending on which one of the four bits was a one. This is performed in blocks 916, 918, 920 and 922. Also performed in blocks 916, 918, 920 and 922 is the setting of the ISAR register to 60, 61, 62 or 63. These registers are the locations where the induction heating coil 118 ACT, BCT, CCT and DCT counts are stored and which vary from zero to 99 to determine the duty cycle of induction heating coils 118 (FIG. 3).

The R2 register is a temporary register and its contents are permanently stored in register R24 in block 924. Register R24 is the register used by Display Routine 712 (FIG. 12) to select the first digit of the four digit display 60 (FIG. 1) which is the letter A, B, C or D when a cooking area power level is being displayed.

After data is stored in register R24, the induction heating coil 118 count is fetched at block 926. The count to be processed is contained in one of registers 60, 61, 62 or 63 depending upon which induction heating coil 118 temperature level is to be displayed. If the count fetched is 100, decided at decision block 928, register R23 is set to a one and registers R22 and R21 are set to zeros at block 930 to display "100". If the count does not equal 100 at decision block 928, a conversion from binary to binary coded decimal is performed at block 932 and the results are stored in registers R23, which is set to a zero, and registers R22 and R21 at block 934. As can be seen, register R23 stores the hundreds digit while register R22 stores the tens digit and register R21 stores the units digit. After the contents of registers R21, R22 and R23 have been set, the Display Digit Processing Routine 672 is exited to the Forty Second Turnoff Routine 674.

Figure 16:
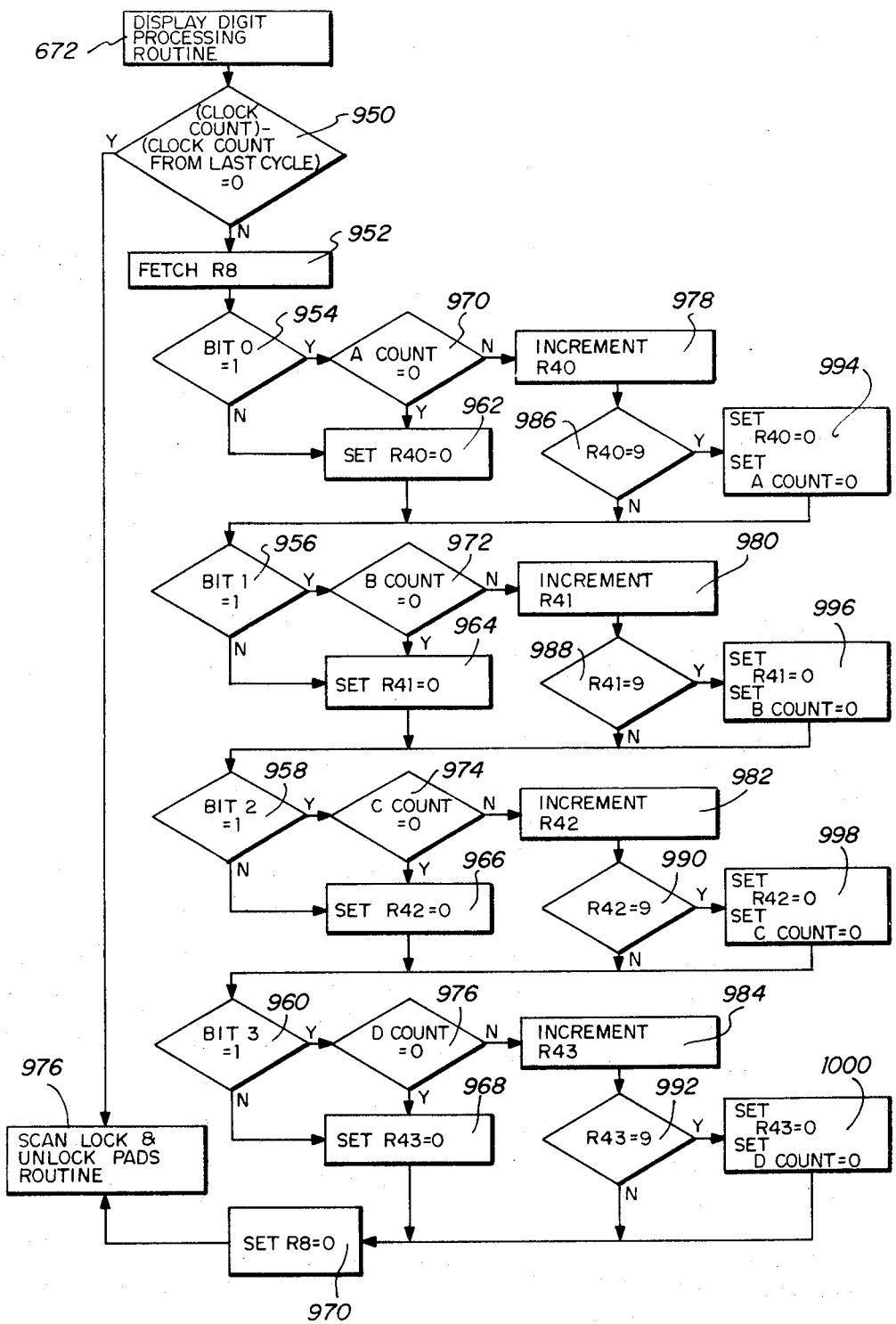
FIG. 16 is a software flow diagram of the Forty Second Turnoff Routine.

Referring to FIG. 16, the software flow diagram for the Forty Second Turnoff Routine 674 (FIG. 10) is illustrated. The Forty Second Turnoff Routine 674 is entered from Display Digit Processing Routine 672 (FIG. 10) and functions to time an induction heating coil 118 for 40 seconds to determine if the induction heating coil 118 should be shut off or be recognized within a 40 second time interval if the pan is returned to the induction heating coil 118 within 40 seconds.

A determination is made at decision block 950 as to whether the clock count has changed since the last performance of the Forty Second Turnoff Routine 674. The clock count changes every five seconds and originates in the Clock Routine 726 (FIG. 14). If the clock count has not changed, the Forty Second Turnoff Routine 674 is exited to the Scan Lock and Unlock Pads Routine 676 (FIG. 10). If the decision of block 950 is no, five seconds have elapsed since the last time the Forty Second Turnoff Routine 674 has been performed and the contents of register R8 are fetched at block 952. The R8 register is the same register as the sources of interrupts 796 of the Gate Pulse Routine 716 (FIG. 13). The lower order four bits of register R8 are tested and if no bits are a logic one, decided at decision blocks 954, 956, 958 and 960, registers R40, R41, R42 and R43 are set to zero at blocks 962, 964, 966 and 968. Register R8 is then set to zero at block 970 and Forty Second Turnoff Routine 674 is exited.

The contents of registers R40, R41, R42 and R43 is a count ranging from zero to 9 utilized for timing the forty seconds. If a decision from decision blocks 954, 956, 958 or 960 is yes, a test is made to determine if the induction heating coil 118 count is zero by testing the contents of registers 60, 61, 62 and 63 at decision blocks 970, 972, 974 and 976. If the count is zero, the particular induction heating coil 118 has been turned off by the operator. Forty Second Turnoff Routine 674 is then exited to the Scan Lock and Unblock Pads Routine 676 (FIG. 10).

If the count in registers R60, R61, R62 or R63 is not zero, the contents of registers R40, R41, R42 or R43 are incremented at blocks 978, 980, 982 and 984. A decision is then made at decision blocks 986, 988, 990 and 992 to determine whether the contents of registers R40, R41, R42 or R43 equals 9 which means that the forty second time interval has elapsed. If the contents of these registers do not equal 9, the routine continues. If the contents of these registers do equal 9, registers R40, R41, R42 or R43 are set to zero and the contents of registers R60, R61 R62 or R63 are set to zero at blocks 994, 996, 998 and 1000 to turn a particular induction heating coil 118 (FIG. 3) off the next time the Gate Pulse Routine 716 (FIG. 10) is executed.

Register R8 is set to zero upon exiting the Forty Second Turnoff Routine 674 so that, if the operator replaces a pan within the next five second time interval, the external pan interrupt sources will be reset to zero.

Figure 17:
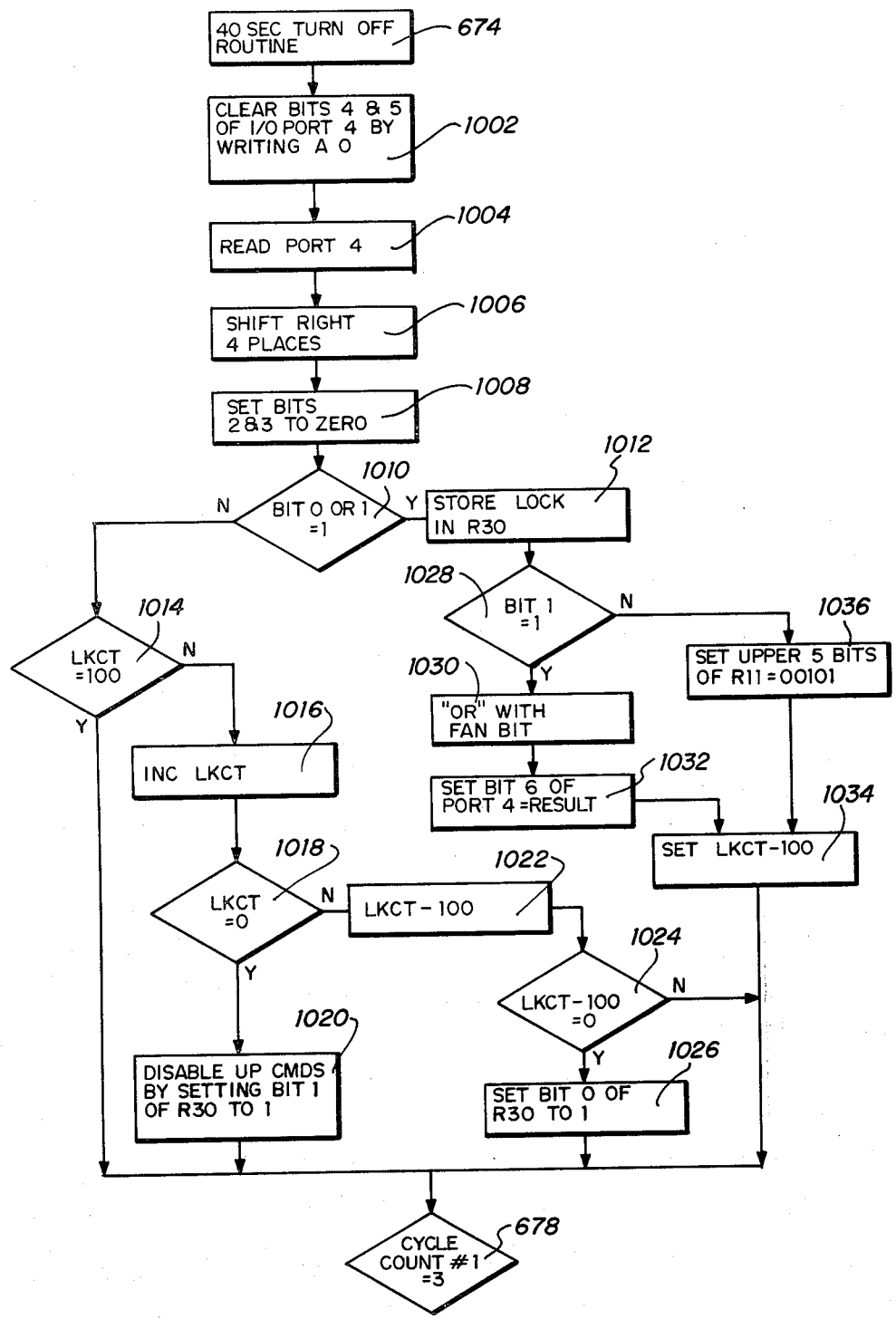
FIG. 17 is a software flow diagram of the Scan Lock and Unlock Pads Routine.

Referring to FIG. 17, the software flow diagram for the Scan Lock and Unlock Pads Routine 676 (FIG. 10) is illustrated. Entrance to the Scan Lock and Unlock Pads Routine 676 is from the Forty Second Turnoff Routine 674 (FIG. 16). Initially, bits 4 and 5 of I/O port 4 of microprocessor circuit 82 are cleared at block 1002 by writing a zero into these bits. Port 4 is used as previously described in the Gate Pulse Routine 716 (FIG. 13). Port 4 is then read at block 1004. Bits 4 and 5 are then shifted right four places at block 1006. Bits 2 and 3 are set to zero at block 1008 such that bits 4 and 5 are shifted to the two least significant bits and all other bits are set to zero.

A decision is then made at block 1010 to determine if bit 0 or bit 1 is a one. If the decision is yes, the program continues at block 1012. If neither bit 0 nor bit 1 was a one, this indicates that there was no lock and no unlock input and the no branch of decision block 1010 is taken. The no branch of block 1010 flows into the decision block 1014 to determine whether the lock count (LKCT) equals 100. If the lock count equals 100, this indicates there was no lock or unlock input within the last 5 seconds and the Scan Lock and Unlock Pads Routine 676 is exited to the decision block 678 (FIG. 10). If the decision at decision block 1014 is no, this indicates that the lock or unlock time interval has been running and counting up from the initial lock count of minus 100.

The lock count is then incremented at block 1016. If the lock count equals zero at the decision block 1018, this indicates that 100 steps of 50 milliseconds have expired since the interrupt and at block 1020 all commands for increasing temperature levels are disabled to prevent an increase in temperature levels of induction heating coils 118 (FIG. 3) except for five seconds after an unlock command has been generated by touching UNLOCK TOUCH CONTROL PAD 52 (FIG. 1). Block 1020 disables the up commands by setting bit 1 of a register R30 to a one. Register R30 is a register that is used to store the lock and unlock bits. After bit 1 of register R30 is set to a one, the Scan Lock and Unlock Pads Routine 676 is exited.

If the lock count is not zero at decision block 1018, block 1022 subtracts 100 from the lock count and a decision is made at decision block 1024 to determine if the lock count was equal to zero. If the result of block 1022 is equal to zero, this means that the lock count is equal to 100. If the decision at decision block 1024 is no, meaning that the lock count is not 100 at decision block 1018, Scan Lock and Unlock Pads Routine 676 is exited. If the lock count is 100 at decision block 1018, the decision at decision block 1024 will be a yes to set bit 0 of R30 to a one at block 1026 to disable the unlocked bit and the Scan and Unlock Pads Routine 676 is exited.

If the decision at decision block 1010 is that bit 0 or bit 1 is a one, this input is stored in register R30 at block 1012. A decision is then made at block 1028 to determine whether there was a lock or an unlock input by checking to see if bit 1 or register R30 is equal to a one. If bit 1 is equal to a one, this condition indicates that there is an unlock input which is then ored with the fan bit at block 1030 which has the effect of turning the fan bit on which turns cook-top surface 40 on by setting bit 6 of port 4 of microprocessor circuit 82 to a one at block 1032. The lock count is then set to minus 100 in register R31 at block 1034. If the decision in block 1028 is no, this indicates that bit 0 is a one, and the upper five bits of register R11 are set at block 1036 to 00101 to switch display 60 to display the time of day. Subsequently, the lock count is set to minus 100 at block 1034. At the completion of setting the lock count to minus 100 at block 1034 from either block 1032 or block 1036, the Scan Lock and Unlock Pad Routine 626 is exited.

Figure 18:
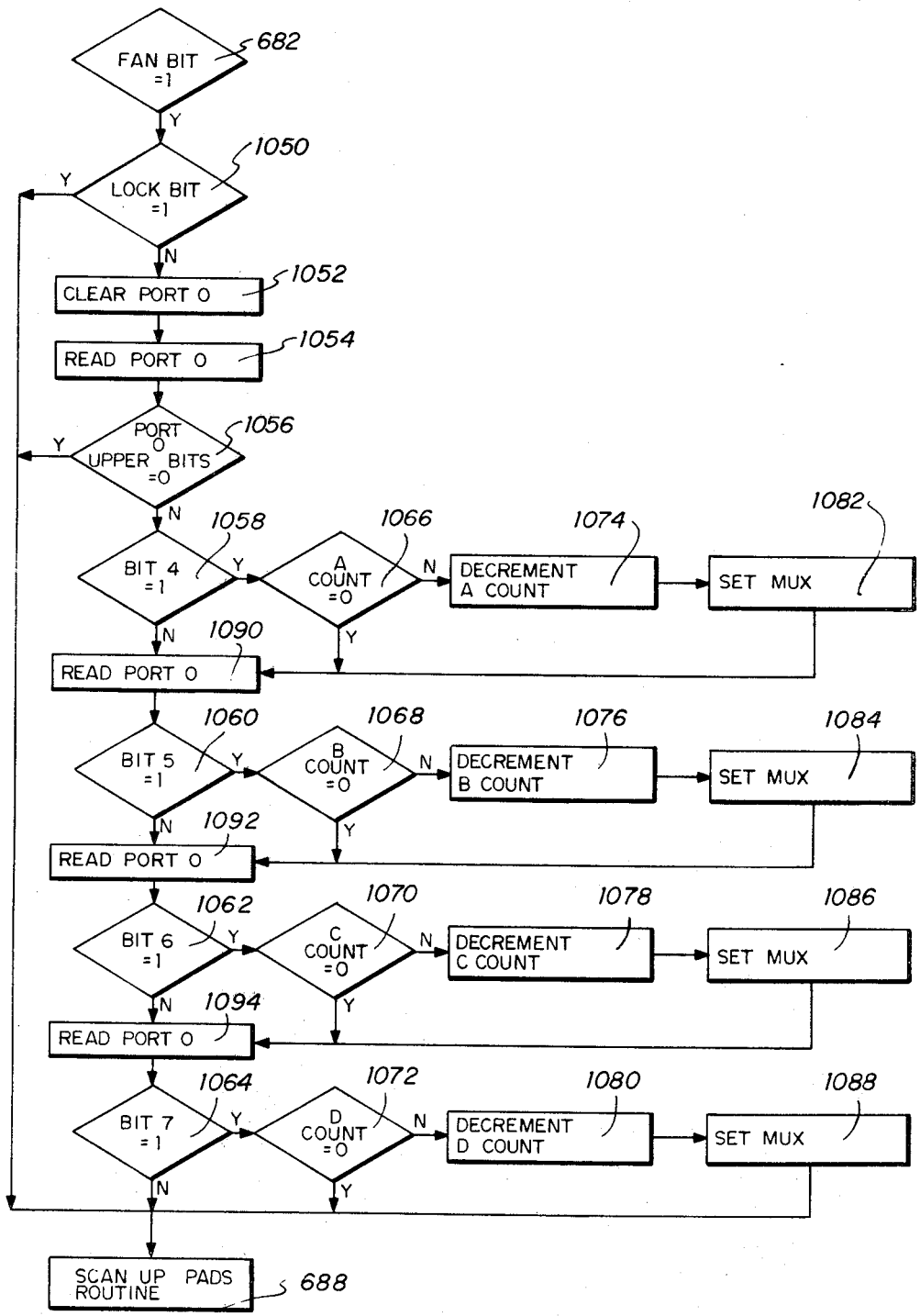
FIG. 18 is a software flow diagram of the Scan Down Pads Routine.

Referring to FIG. 18, the software flow diagram for the Scan Down Pads Routine 686 (FIG. 10) is illustrated. If the fan bit is equal to a one as tested in decision block 682 (FIG. 10), the decision is made at block 1050 as to whether the lock bit equals a one. If the lock bit, which is stored in register R30 is a one, no changes can be made to the temperature levels of induction heating coils 118 and the Scan Down Pads Routine 686 is exited to the Scan Up Pads Routine 688 (FIG. 10).

If the decision at decision block 1050 is that the lock bit is not a one, then port 0 of microprocessor circuit 82 is cleared at block 1052, and port 0 is read at block 1054.

The four upper bits of port 4 are the down inputs for induction heating coils 118A, B, C and D. If all four of these four upper bits are zero, decided at decision block 1056, the Scan Down Pads Routine 686 is exited to the Scan Up Pads Routine 688.

If the decision at decision block 1056 is no, decisions are made at decision blocks 1058, 1060, 1062 and 1064 to determine which of the upper four bits is a one. If the decision from decision blocks 1058, 1060, 1062 and 1064 indicate that an upper bit is a one, a decision is then made at decision blocks 1066, 1068, 1070 and 1072 to determine if the count of an induction heating coil 118 is zero. If the count is zero, this indicates that the heating level of an induction heating coil 118 cannot be decreased any further. If the decision at decision blocks 1066, 1068, 1070 or 1072 indicate that the count is not zero, the heating level of the appropriate induction heating coil 118 is decremented in registers R60, R61, R62 and R63 which store the count for setting the duty cycle of an induction heating coil 118. The MUX register is then set at blocks 1082, 1084, 1086 and 1088 which is utilized in the Display Digit Processing Routine (FIG. 15) to indicate which heating level of the four induction heating coils 118 is to be displayed in display 60 (FIG. 1). Each time a command is received from an induction heating coil 118 to decrease the heating level, the multiplex word is set to that particular induction heating coil 118 so that display 60 switches to display the heating level of the particular induction heating coil 118 which is to be changed on the next refresh cycle.

Testing is performed for each induction heating coil 118 to determine if a LOW TOUCH CONTROL PAD 70 was touched. If a no decision at decision block 1058 was reached and after the MUX register is set at block 1082, the program reads port 0 at block 1090. Similarly, at the completion of decrementing the B count and C count, port 0 of microprocessor circuit 82 is read at blocks 1092 and 1094. Ultimately, after each LOW TOUCH CONTROL PAD 70 is scanned, the Scan Down Pads Routine 686 returns to the Scan Up Pads Routine 688.

Figure 19:
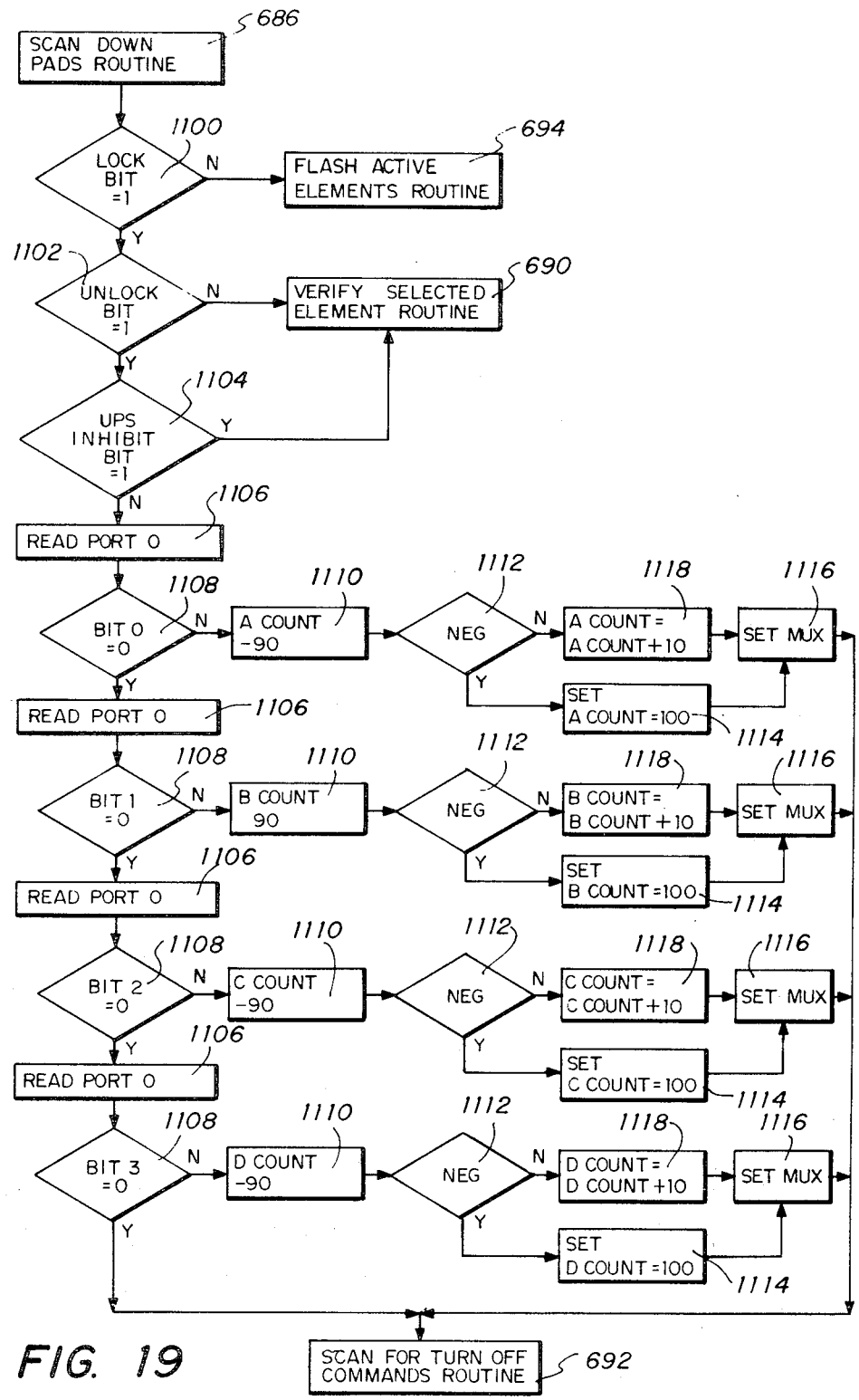
FIG. 19 is a software flow diagram of the Scan Up Pads Routine.

Referring to FIG. 19, the Scan Up Pads Routine 688 (FIG. 10) is illustrated. Decision block 1100 determines if the locked bit is a one. If the decision is no, the routine continues with the Flash Active Elements Routine 694 (FIG. 10). If the decision at decision block 1100 is yes, this indicates that cook-top surface 40 is not locked and the Scan Up Pads Routine 688 continues to determine if any of HI TOUCH CONTROL PADS 70 (FIG. 1) have been touched. A decision is made at decision block 1102 to determine whether the unlock bit equals a one. If the unlock bit is not a one, this indicates that HI TOUCH CONTROL PADS 70 are not unlocked and the heating level of induction heating coils 118 cannot be incremented. The no branch of decision block 1102 then flows to the Verify Select Elements Routine 690 (FIG. 10).

If the yes branch of decision block 1102 is taken, this indicates that cook-top surface 40 is unlocked and heating levels can be increased provided that a no decision is received at decision block 1104. Decision block 1104 tests to determine if the UPS inhibit bit equals a one. This bit is stored in a register R26 and is set to a one if an off command was present during the Scan For Turnoff Commands Routine 692 (FIG. 10) during the previous cycle. This bit prevents an increase in a temperature level of an induction heating coil 118 if the operator were to remove his finger first from a LOW TOUCH CONTROL PAD 72 and then from a HI TOUCH CONTROL PAD 70. This circumstance could arise if the operator were turning cook-top surface 40 off.

Assuming that the UPS inhibit bit is not a one, port 0 of microprocessor circuit 82 is read at block 1106. The lower order four bits are read, bit 0 corresponding to induction heating coil 118A. The Scan Up Pads Routine 688 will now be discussed, particularly with reference to induction heating coil 118A. Similar functions will be identified with like numerals for induction heating coils 118B, C and D.

If bit 0 is a one, as decided by the no branch of decision block 1108, it is necessary to determine whether the A count stored in register R60 for induction heating coil 118A is less than 90. Since the heating levels of induction coils 118 are incremented in units of ten, it is necessary to determine whether a further increment in heating level of an induction coil 118 can be made. Block 1100 subtracts 90 from the A count and a decision is made at block 1112 to determine the difference between the A count and 90. If a negative number results at decision block 1112, the A count is set to 100 at block 1114 and the multiplex word is set at block 1116 to display an "A" in display 64 (FIG. 1). If the result of decision block 1112 is no, the A count is incremented by ten in register R60. The multiplex word is then set in block 1116.

Port 0 is then read again for each of the remaining induction heating coils 118B, C and D. After increasing the heating level of the remaining induction heating coils 118 as necessary based on the up touch pad inputs, the Scan Up Pads Routine 688 is exited to the Scan For Turnoff Commands Routine 692 (FIG. 10). However, if any one of the remaining induction heating coils 118 is not increased, the remaining up touch pad inputs for the induction heating coils 118 are tested to determine if an increase command was present.

Figures 20, 21:
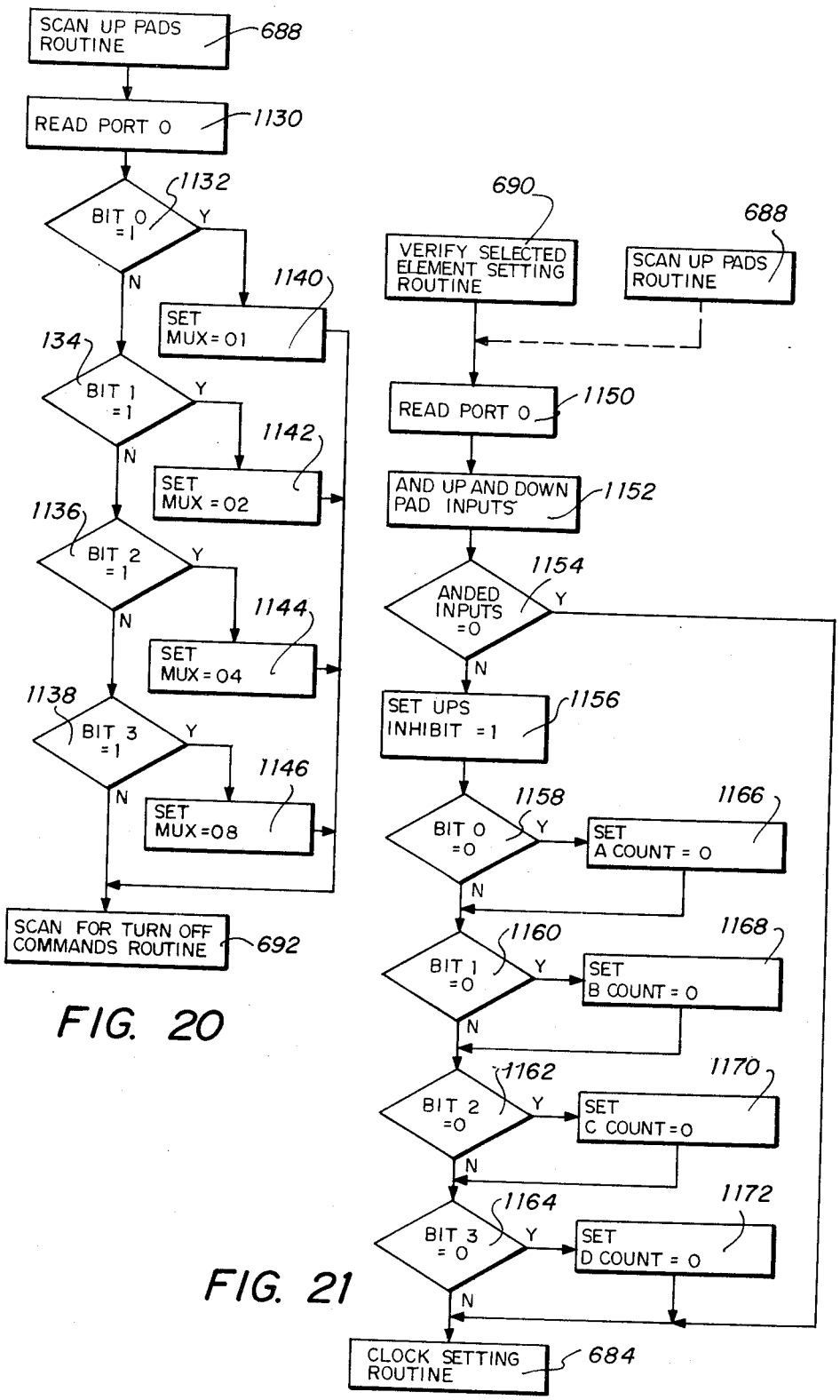
FIG. 20 is a software flow diagram of the Verify Selected Element Setting Routine.
FIG. 21 is a software flow diagram of the Scan For Turnoff Commands Routine.

Referring to FIG. 20, the Verify Selected Elements Setting Routine 690 (FIG. 10) is illustrated. The function of the Verify Selected Elements Setting Routine 690 is to switch display 60 (FIG. 1) to display the heating level of an induction heating coil 118 for the particular induction heating coil 118 heating level being verified. If cook-top surface 40 were not unlocked, Verify Selected Elements Setting Routine 690 does not change the power level of any induction heat coil 118. Port 0 of microprocessor circuit 82 is read at 1130, and if any of the lower order four bits is high, as decided by decision blocks 1132, 1134, 1136 or 1138, the multiplex register is set at blocks 1140, 1142, 1144 or 1146 such that display 60 would be switched to display the heating level of one of the four induction heating coils 118. Basically, Verify Selected Elements Setting Routine 690 switches display 60 without changing any of the counts of registers R60, R61, R62 and R63. The program flow exits the Verify Selected Elements Setting Routine 690 to the Scan For Turnoff Commands Routine 692.

Referring to FIG. 21, the software for the Scan for Turnoff Commands Routine 692 (FIG. 10) is illustrated. Entrance to the Scan For Turnoff Commands Routine 692 can come from either of the Scan Up Pads Routine 688 or the Verify Selected Elements Setting Routine 690. Port 0 of microprocessor circuit 82 is read at block 1150. The intput from HI TOUCH CONTROL PADS 70 and LOW TOUCH CONTROL PADS 72 (FIG. 2) are anded at block 1152 since actuation of both these pads is required to generate the off command. Block 1152 ands both the upper and lower halves of port 0. A decision is then made at block 1154 to determine if the anded inputs of block 1152 equal zero. If the decision at block 1154 is yes, the Scan For Turnoff Commands Routine 692 is exited to the Clock Setting Routine 684.

If the decision at block 1154 is no, this indicates that an off command is received. The UPS inhibit bit is set to a one at block 1156. The lower four bits are then tested at decision blocks 1158, 1160, 1162 and 1164 to determine which bit is a zero. If bit 0 is a zero, this indicates that induction heating coil 118A is to be turned off, which sets the A count to zero at register R60 at block 1166. Similarly, if either of bits 1, 2 or 3 is a zero, the B count, C count and D count are set to zero at blocks 1168, 1170 and 1172. If none of bits 0, 1, 2 or 3 were a one, no off command was present and the Scan For Turnoff Commands Routine 692 is exited to the Clock Setting Routine 684 (FIG. 10). When the contents of registers R60, R61, R62 or R63 are set to zero, the display indicators 58 (FIG. 1) are turned off.

Figure 22:
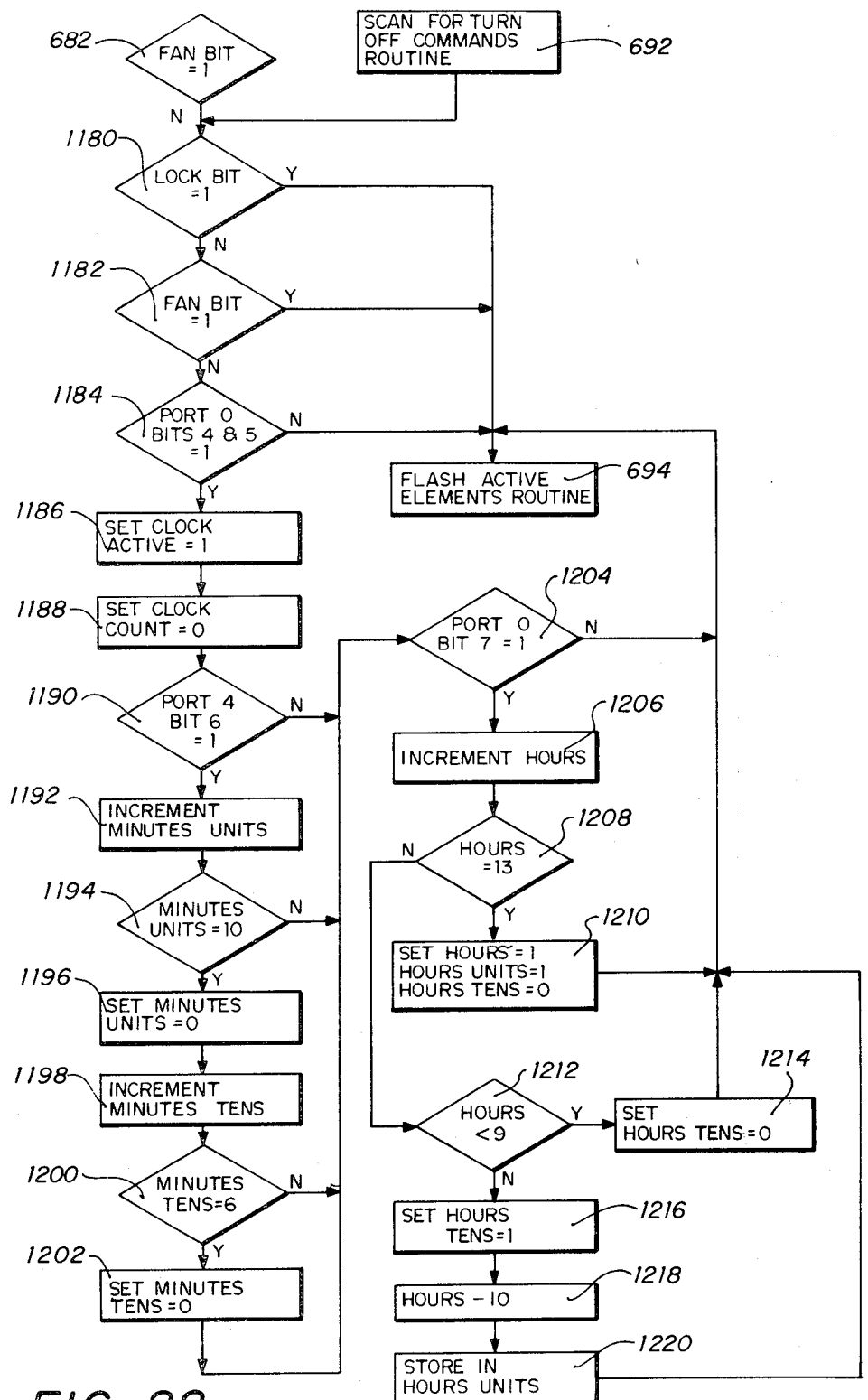
FIG. 22 is a software flow diagram of the Clock Setting Routine.

Referring to FIG. 22, the software flow diagram for the Clock Setting Routine 684 (FIG. 10) is illustrated. Clock Setting Routine 684 tests to determine whether the proper conditions exist for setting the time of day clock of display 60 (FIG. 1). Entrance into the Clock Setting Routine 684 can be either from the no decision of decision block 682 (FIG. 10) or from the Scan For Turnoff Commands Routine 692 (FIG. 21). A decision is made at decision block 1180 to determine whether the lock bit is a one. If the lock bit is a one, the program exits from Clock Setting Routine 684 to the Flash Active Elements Routine 694 (FIG. 10). If the lock bit is not a one, a decision is made at decision block 1182 to determine whether the fan bit is a one. If the fan bit is equal to a one, cook-top surface 40 is on, in which case the clock display 60 cannot be set and Clock Setting Routine 684 exits to the Flash Active Elements Routine 694. If the fan bit is not equal to a one, a decision is then made at decision block 1184, which tests bits 4 and 5 of port 0 of microprocessor circuit 82. If both bits 4 and 5 of port 0 are not equal to a one, Clock Setting Routine 684 exits to the Flash Active Elements Routine 694.

If both bits 4 and 5 of port 0 are equal to a one, the clock active register is set to a 1 at block 1186. The clock count is then set to a zero at block 1188. The clock count is used to count the five second time interval. A decision is made as to whether bit 6 of port 0 is equal to a one at decision block 1190. This bit is an input that increments the minutes of the clock of display 60. If the bit 6 of port 4 is a one, the minutes units are incremented at block 1192, and a decision is made at decision block 1194 to determine if the minutes units equals ten. If the decision at decision block 1194 is yes, the minutes units is set to zero at block 1196 and the minutes tens units are incremented at block 1198.

A decision is then made at decision block 1200 to determine if the minutes tens units equals 6. If the minutes tens units equals 6, the minutes tens units is set to zero at block 1202. The program continues to decision block 1204 to determine if bit 7 of port 0 is a one. The no branch of decision blocks 1190, 1194 and 1200 also flow to decision block 1204. If port 0, bit 7 is equal to a one, the hours are incremented at block 1206. If bit 7 of port 0 is not equal to a one, the Clock Setting Routine 684 is exited to the Flash Active Elements Routine 694.

A decision is then made at decision block 1208 to determine if the number of hours equals 13. If the yes branch of decision block 1208 is taken, the hours are set to a one, the hours units are set to a one and the hours tens are set to zero at block 1210 and Clock Setting Routine 684 is exited. If the no branch of decision block 1208 is taken, a decision is made at decision block 1212 to determine if the number of hours is less than 9. If the decision at decision block 1212 is yes, the hours tens units are set to zero at block 1214 and Clock Setting Routine 684 is exited. If the decision at decision block 1212 is no, the hours tens units are set to a one at block 1216 and ten is subtracted from the hours units at block 1218. The result of the subtraction performed in block 1218 is stored in the hours units at block 1220 and the Clock Setting Routine 684 is exited.

Figure 23:
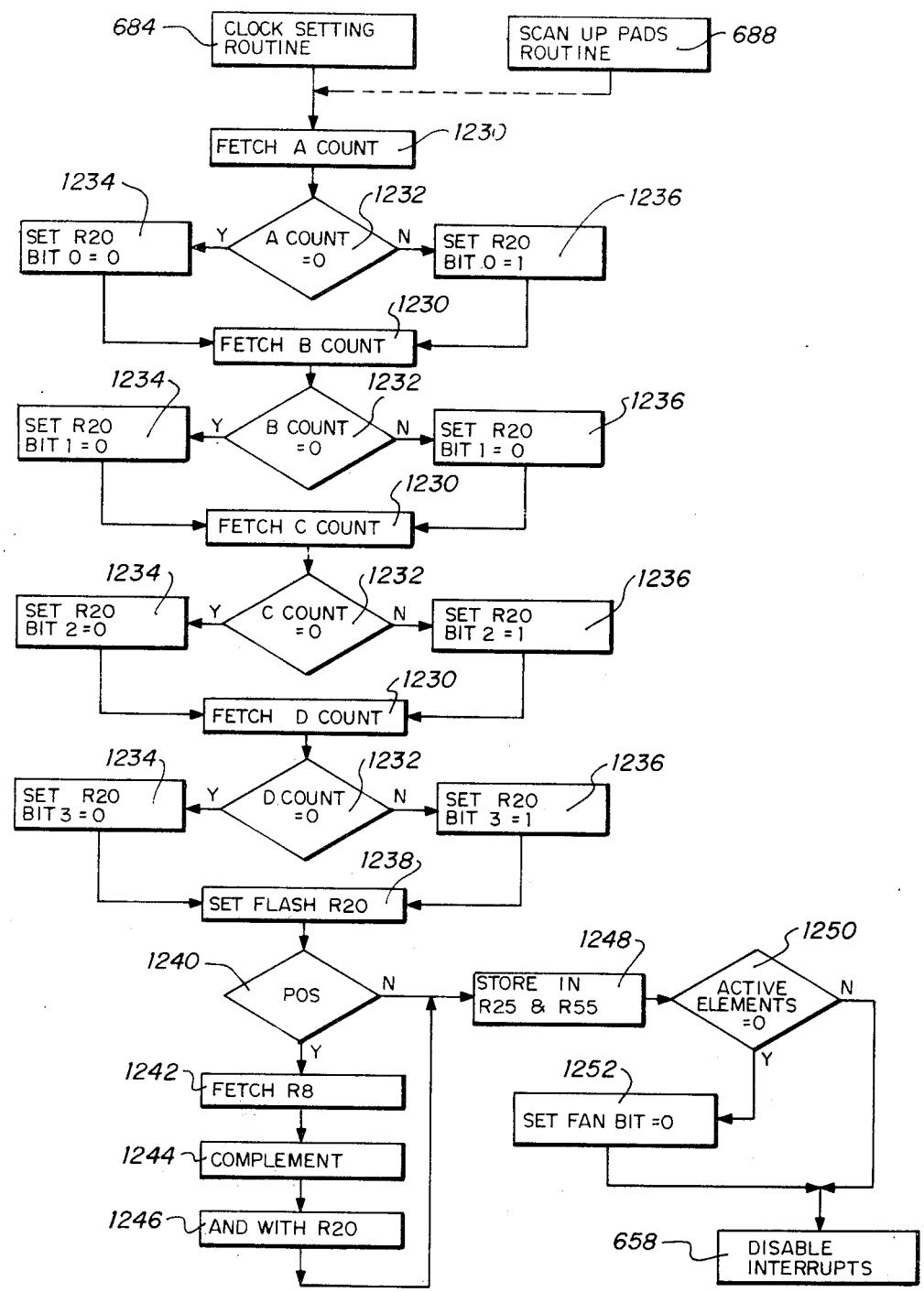
FIG. 23 is a software flow diagram of the Flash Active Elements Routine.

Referring to FIG. 23, the software flow diagram for the Flash Active Elements Routine 694 (FIG. 10) is illustrated. Entrance to this routine can come from either the Clock Setting Routine 684 (FIG. 22) or the Scan Up Pads Routine 688 (FIG. 19). The Flash Active Elements Routine 694 functions to determine which induction heating coil 118 is active and to flash the status display indicators 58 (FIG. 1) of those induction heating coils (118) which are active but not loaded. If none are active, Flash Active Elements Routine 694 extinguish the status display indicators 58 (FIG. 1).

The A count of register R60 is fetched at block 1230. A decision is made at decision block 1232 to determine if the A count is zero. If the A count is zero, the induction heating coil 118A is not active and bit 0 of register R20 is set to zero at block 1234. If the decision at decision block 1232 is no, bit 0 of R20 is set to a one at block 1236. Similarly, bit 1, bit 2 and bit 3 of register R20 is set to a zero or a one for each of induction heating elements 118B, C and D. Like numerals are utilized for these similar functions as previously identified for the setting of bit 0 of register R20.

At block 1238, the flash of status display indicators 58 (FIG. 1) is set by adding the contents of register R20 to a value provided by the External Interrupt Routine 696 (FIG. 10). A decision is made at decision block 1240 to determine whether the content of register R20 is positive. If the content is positive, the content of register R8 is fetched at block 1242. The complement of the content of register R8 is taken at block 1244 and is anded with the content of register R20 at block 1246. The result of block 1246 is then stored in registers R25 and R55 which are utilized in Display Routine 712 (FIG. 12). The data stored in registers R25 and R55 cause the status display indicators 58 to flash every other cycle controlled by the contents of register R20.

A decision is made at decision block 1250 to determine if no induction heating coils 118 are active. If no elements are active at decision block 1250, the fan bit is set to zero at block 1252, indicating that all induction heating coils 118 have timed out or have been turned off by the operator and the Flash Active Elements Routine 694 is exited to the disable interrupts block 658 (FIG. 10). If a decision at the decision block 1250 is no, the Flash Active Elements Routine 694 exits to the disable interrupt block 658 (FIG. 10).

Figure 24:
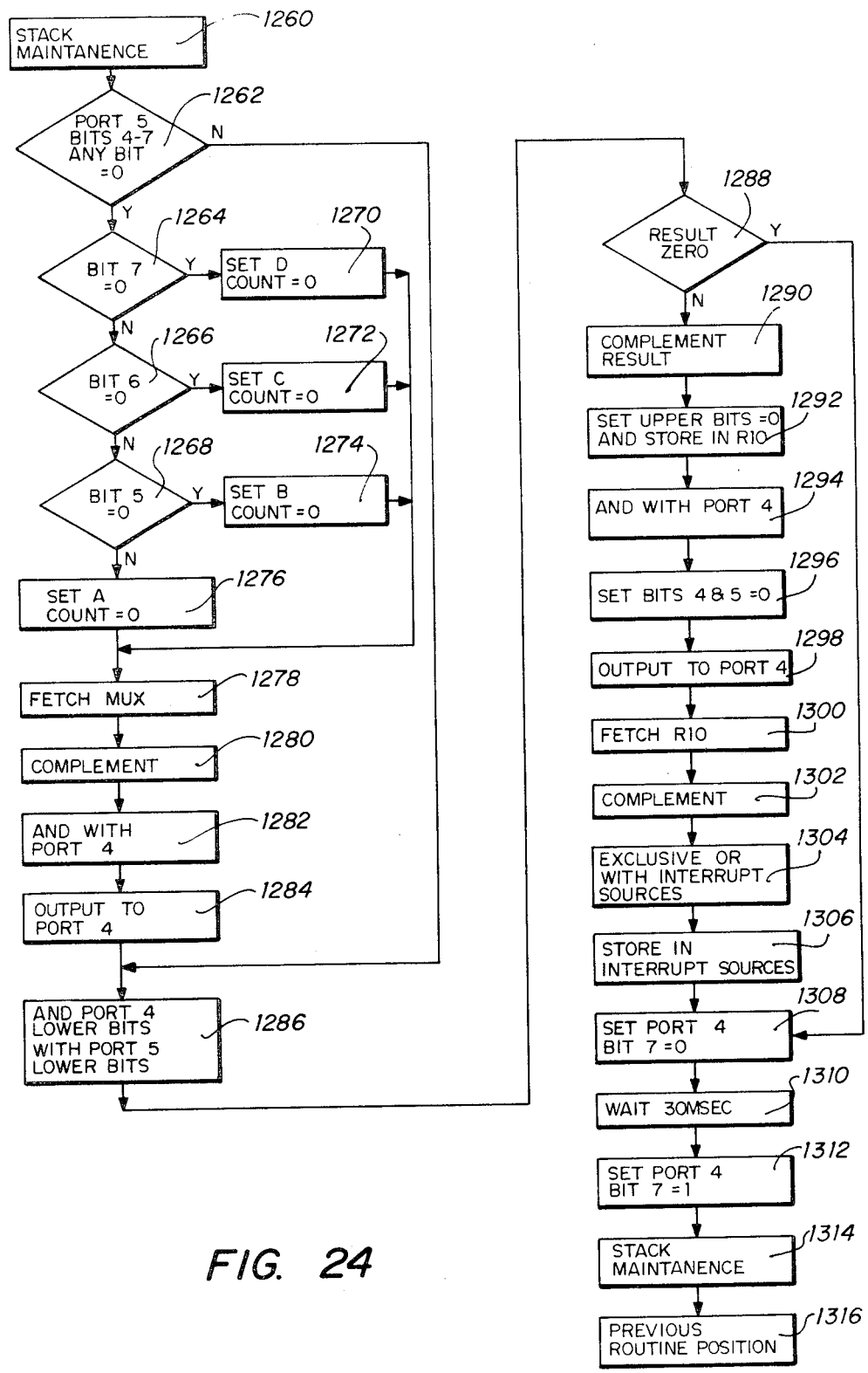
FIG. 24 is a software flow diagram of the External Interrupt Routine.

Referring to FIG. 24, the External Interrupt Routine 696 (FIG. 10) is illustrated. The External Interrupt Routine is entered when the microprocessor circuit 82 acknowledges an EXTERNAL INTERRUPT signal from temperature sensors 92 or pan sensors 96 (FIG. 3). Bits 4 through 7 of port 5 of microprocessor circuit 82 are then read and a decision is made at decision block 1262 to determine whether bits 4 through 7 are equal to zero. If the decision at decision block 1262 is yes, decisions are made at decision blocks 1264, 1266 and 1268 to determine which bit, bit 4, 5, 6 or 7, is equal to zero. If bit 7 is equal to zero, the D count is set to zero at block 1270. If bit 6 is equal to zero at decision block 1266, C count is set to zero at block 1272. If bit 5 is equal to zero at decision block 1268, B count is set to zero at block 1274. Similarly, if the decision at decision block 1268 is no, A count is set to zero at block 1276.

The setting of D count, C count, B count and A count to zero causes an induction heating coil 118 to be turned off that received a temperature interrupt and displays a zero in display 60 (FIG. 1) for the particular induction heating coil 118. The multiplex word is fetched at block 1278 from blocks 1270, 1272, 1274 and 1276 and is complemented at block 1280. At block 1282, the complement of the multiplexed word is anded with port 4 and is output to port 4 at block 1284. The output to port 4 turns the gate bit off for the induction heating coil 118 which generated an interrupt via temperature sensors 92 (FIG. 3) to microprocessor circuit 82.

At the completion of the output to port 4, the lower bits of port 4 are anded with the lower bits of port 5 at block 1286 which represent the inputs of pan sensors 96 (FIG. 3). Decision block 1288 tests the result of block 1286. If the result is zero, no interrupt is present and the program exits from the External Interrupt Routine 696. If the result is not zero from decision block 1288, then at least one of induction heating coils 118 had a pan sensor interrupt. The result is complemented at 1290 and at block 1292 the upper bits are set to zero and the result stored in register R10. At block 1294, the result of block 1292 is anded with port 4. Bits 4 and 5 are set to zero at block 1296 and the result output to port 4 at block 1298. R10 is then fetched at block 1300 and complemented at block 1302. The complement of R10 is then exclusive ored with the interrupt sources at block 1304 and is stored in register R8 at block 1306. The content of register R8 then indicates which of induction heating coils 118 had a load removed.

At block 1308 bit 7 of port 4 is set to zero. The setting of bit 7 of port 4 acknowledges the fact that microprocessor circuit 82 has serviced the interrupt. The setting of bit 7 of port 4 of microprocessor circuit 82 is indicated to the logic circuitry of FIG. 5 by an output on signal line 255 (FIG. 5). This pulse is maintained for 30 microseconds at block 1310 to insure that the pulse is wide enough when output. Bit 7 of port 4 is then set to a one at block 1312 and the External Interrupt Routine 696 is exited through stack maintenance 1314 to the address of the main program which was to be executed next prior to the external interrupt at block 1316.

The present invention has thus been described as an induction heating cook-top surface with many operational and functional improvements. The present cooktop surface includes an improved touch control system with many unique safety features. Furthermore, the present system includes a unique display in connection with the use of a microprocessor for accurately and conveniently displaying heat levels associated with multiple induction heating coils.

Whereas the present invention has been described with respect to specific embodiments thereof, it will be understood that various changes and modifications will be suggested to one skilled in the art, and it is intended to encompass such changes and modifications as fall within the scope of the appended claims.

We claim:

1. In an induction cooking system the combination comprising:

a plurality of induction heating coils operable at a plurality of power levels;

energization means for electrically energizing said plurality of induction heating coils;

at least one touch control pad for being touched by an operator to generate energization control signals in response to a ground potential provided by the body of the operator;

means responsive to said energization control signals generated by said at least one touch control pad for actuating and controlling said energization means to thereby vary the energization of said plurality of induction heating coils; and circuit means for maintaining said at least one touch control pad operable when an operator of the induction cooking system is in contact with a utensil disposed adjacent to said plurality of induction heating coils by eliminating the effect of electrical noise.

2. The combination of claim 1 wherein said at least one touch control pad comprises:

a first touch control pad associated with each one of said plurality of induction heating coils for being touched to increase the output of said energization means to thereby increase the heating power of said associated one of said plurality of induction heating coils; and a second touch control pad associated with each one of said plurality of induction heating coils for being touched to decrease the output of said energization means to thereby decrease the heating power of said associated one of said plurality of induction heating coils.

3. The combination of claim 2 wherein said circuit means includes:

resistive voltage divider means interconnected to said first and second touch control pads associated with each one of said plurality of induction heating coils.

4. A method for operating an induction cooking system having touch control pads associated with an induction heating coil energized by an energization source, wherein during the course of operating the induction cooking system, the operator touches both a touch control pad for sensing touch in response to a grounding potential provided by the body of the operator and a cooking utensil disposed adjacent the induction heating coil comprising the steps of:

generating a high impedance level at the output of the touch control pad; and applying a high voltage level to the touch control pad, such that the high voltage level is substantially above the voltage level of noise generated by the energization source and impressed on the touch control pad through the operator so that the high impedance level reduces the voltage level at the output of the touch control pad to control the energization of the induction heating coil and eliminate the influence of the noise in operating the induction cooking system to insure operability of the touch control pad when the operator is touching the cooking utensil disposed adjacent the induction heating coil.

5. In an induction cooking system the combination comprising:

a plurality of induction heating coils operable at a plurality of power levels;

energization means for electrically energizing said plurality of induction heating coils;

at least one touch control pad associated with each of said plurality of induction heating coils for being touched by an operator to generate energization control signals, said at least one touch control pad generating energization control signals in response to grounding of the touched said at least one control pad by the body of the operator;

means responsive to said energization control signals generated by said at least one touch control pad for actuating and controlling said energization means to thereby vary the energization of said plurality of induction heating coils; and circuit means for maintaining said at least one touch control pad operable when an operator is in contact with a pan disposed adjacent said plurality of induction heating coils by eliminating the influence of electrical noise transferred from said plurality of induction heating coils, through the body of the operator and impressed upon the touched touch control pad.

6. The combination of claim 5 wherein said circuit means includes:

means for applying a predetermined voltage to said at least one touch control pad.

7. The combination of claim 6 wherein said at least one touch control pad includes:

a first touch control pad associated with each one of said plurality of induction heating coils for being touched to increase the output of said energization means to thereby increase the power level of said associated one of said plurality of induction heating coils; and a second touch control pad associated with each one of said plurality of induction heating coils for being touched to decrease the output of said energization means to thereby decrease the power level of said associated one of said plurality of induction heating coils.

8. The combination of claim 7 wherein said circuit means includes:

a high impedance resistive voltage divider means interconnected to said first and second touch control pads associated with each one of said plurality of induction heating coils; and means for applying a high voltage level to said high impedance resistive voltage divider means.

9. The combination of claim 8 wherein said high voltage level is substantially above the voltage level of noise generated by said plurality of induction heating coils.

10. The combination of claim 9 wherein said means responsive to said energization control signals comprises an electronic digital processor means.

11. In an induction cooking system the combination comprising:

a plurality of induction heating coils operable at a plurality of power levels;

energization means for electrically energizing said plurality of induction heating coils;

a first touch control pad associated with each one of said plurality of induction heating coils for being touched by an operator to ground said first touch control pad at the potential of the body of the operator to increase the output of said energization means to thereby increase the power level of said associated one of said plurality of induction heating coils;

a second touch control pad associated with each one of said plurality of induction heating coils for being touched by an operator to ground said second control pad at the potential of the body of the operator to decrease the output of said energization means to thereby decrease the power level of said associated one of said plurality of induction heating coils;

means responsive to said energization control signals generated by said first and second touch control pads for actuating and controlling said energization means to thereby vary the energization of said plurality of induction heating coils;

a high impedance resistive voltage divider means interconnected to said first and second touch control pads associated with each one of said plurality of induction heating coils; and means for applying a high voltage level to said high impedance resistive voltage divider means such that said high impedance resistive voltage divider means and said means for applying a high voltage level maintain said first and second touch control pads operable when an operator of the induction cooking system is in contact with a cooking utensil disposed adjacent one of said plurality of induction heating coils and electrical noise is transferred from said plurality of induction heating coils, through the body of the operator and impressed upon said first and second touch controls.

12. The combination of claim 11 wherein said high voltage level is substantially above the voltage level of noise generated by said plurality of induction heating coils.

13. The combination of claim 12 wherein said means responsive to said energization control signals comprises an electronic digital processor means.

* * * * *

UNITED STATES PATENT AND TRADEMARK OFFICE
CERTIFICATE OF CORRECTION

PATENT NO. : 4,308,443
DATED : December 29, 1981
INVENTOR(S) : Raymond M. Tucker et al.

It is certified that error appears in the above-identified patent and that said Letters Patent are hereby corrected as shown below:

Col. 1, line 24, "cooling" should be --cooking--.

Col. 2, line 6, "signal" should be --signals--.

Col. 3, line 52, "aread" should be --areas--.

Col. 5, line 56, "810,169" should be --819,169--.

Col. 7, line 8, "buffer 152" should be --buffer 162--.

Col. 8, line 12, "gate 242" should be --gate 252--;

line 21, "CLOCk" should be --CLOCK--;

line 45, "120" should be --126--.

Col. 16, line 50, "area" should be --areas--.

Col. 23, line 1, "recognized" should be --reenergized-- line 15, "sources" should be --source--;

line 32, "Unblock" should be --Unlock--.

Col. 24, line 42, "or" should be --of--.

UNITED STATES PATENT AND TRADEMARK OFFICE
CERTIFICATE OF CORRECTION

PATENT NO. : 4,308,443
DATED : December 29, 1981
INVENTOR(S) : Raymond M. Tucker et al It is certified that error appears in the above—identified patent and that said Letters Patent is hereby corrected as shown below:

Col. 27, line 35, "clock display" should be -- clock of display --;
line 49, before "bit" delete "the".

Signed and Sealed this

Eleventh Day of May 1982

[SEAL]

Attest:

GERALD J. MOSSINGHOFF

Attesting Officer

Commissioner of Patents and Trademarks